United States Patent
Chism, II

(10) Patent No.: US 11,940,488 B2
(45) Date of Patent: Mar. 26, 2024

(54) SYSTEMS AND METHODS FOR HIGH PRECISION OPTICAL CHARACTERIZATION OF CARRIER TRANSPORT PROPERTIES IN SEMICONDUCTOR MANUFACTURING

(71) Applicant: XCalipr Corporation, Dover, DE (US)

(72) Inventor: William W. Chism, II, Austin, TX (US)

(73) Assignee: XCALIPR CORPORATION

( * ) Notice: Subject to any disclaimer, the term of this patent is extended or adjusted under 35 U.S.C. 154(b) by 0 days.

(21) Appl. No.: 17/828,284

(22) Filed: May 31, 2022

(65) Prior Publication Data

US 2022/0291281 A1     Sep. 15, 2022

Related U.S. Application Data

(63) Continuation-in-part of application No. 17/149,303, filed on Jan. 14, 2021, now Pat. No. 11,402,429, which is a continuation of application No. 15/855,142, filed on Dec. 27, 2017, now Pat. No. 10,921,369.

(Continued)

(51) Int. Cl.
   *G01R 31/28*        (2006.01)
   *G01R 31/309*     (2006.01)

(52) U.S. Cl.
   CPC ....... *G01R 31/309* (2013.01); *G01R 31/2831* (2013.01)

(58) Field of Classification Search
   CPC .................................................. G01R 31/2831
   See application file for complete search history.

(56) References Cited

U.S. PATENT DOCUMENTS 10,839,302 B2    11/2020    Wright et al.
11,093,840 B2     8/2021    Rothstein et al.
(Continued)

OTHER PUBLICATIONS

J. Adler and O. Oktem, "Solving ill-posed inverse problems using iterative deep neural networks," arXiv preprint arXiv:1704.04058v2 (2017).

(Continued)

*Primary Examiner* — Charlie Y Peng
(74) *Attorney, Agent, or Firm* — The Langley Law Firm, P.C.

(57) ABSTRACT

A precise optical technique for measuring electronic transport properties in semiconductors is disclosed. The sensitivity of the technique to electronic transport properties follows from a simple analytic expression for the Z dependence of a photo-modulated reflectance signal in terms of the (complex) carrier diffusion length. The sensitivity of the technique to electronic transport properties also enables a trained neural network to predict electronic transport properties directly from Z-scan photo-modulated reflectance data. Synthetic data and/or physical constraints may be derived from the analytical expression and incorporated into a machine learning algorithm. Moreover, electronic transport properties as determined or predicted may be used to enable machine learning based control of semiconductor process tools and/or manufacturing processes, including via advanced reinforcement learning algorithms.

14 Claims, 7 Drawing Sheets

Related U.S. Application Data

(60) Provisional application No. 62/498,685, filed on Jan. 5, 2017.

(56) References Cited

U.S. PATENT DOCUMENTS

| | | | |
|---|---|---|---|
| 2014/0107828 A1* | 4/2014 | Zhu | H01L 22/14 700/121 |
| 2017/0193400 A1 | 7/2017 | Bashkar et al. | |
| 2019/0064253 A1* | 2/2019 | David | G01R 31/2642 |
| 2019/0369503 A1 | 12/2019 | Ympa et al. | |
| 2020/0110341 A1 | 4/2020 | Mossavat et al. | |
| 2020/0111689 A1 | 4/2020 | Banna et al. | |
| 2020/0264335 A1 | 8/2020 | Bhatia et al. | |
| 2020/0303266 A1 | 9/2020 | Jeong et al. | |
| 2020/0333774 A1 | 10/2020 | Banna | |
| 2021/0247744 A1 | 8/2021 | Farenkopf et al. | |
| 2022/0035979 A1 | 2/2022 | Moffat et al. | |
| 2022/0066411 A1 | 3/2022 | Ummethala et al. | |
| 2022/0083034 A1 | 3/2022 | Wu | |

OTHER PUBLICATIONS

A.G. Baydin et al., "Automatic Differentiation in Machine Learning: a Survey," arXiv preprint arXiv:1502.05767v4 (2018).

B. Kiumarsi et al., "Optimal and Autonomous Control Using Reinforcement Learning: A Survey," IEEE Trans. Neural Netw. Learn. Syst. 29, 2042-2061 (2018).

M. Raissi et al., "Physics-Informed Neural Networks: A Deep Learning Framework for Solving Forward and Inverse Problems Involving Nonlinear Partial Differential Equations," preprint submitted to J. Comp. Phys., Oct. 26, 2018, 45 pages.

C.C. Margossian, "A Review of Automatic Differentiation and its Efficient Implementation," arXiv preprint arXiv:1811.05031v2 (2019).

P. Timoney et al., "Advanced Machine Learning Eco-System to Address HVM Optical Metrology Requirements," Proc. SPIE 11325, 113251H (2020).

S. Spielberg et al., "Deep Reinforcement Learning for Process Control: A Primer for Beginners," arXiv preprint arXiv:2004.05490v1 (2020).

Y. Chen et al., "Physics-informed neural networks for inverse problems in nano-optics and metamaterials," Optics Express 28, 11618-11633 (2020).

Z.J. Viharos and R. Jakab, "Reinforcement Learning for Statistical Process Control in Manufacturing," Measurement 182, 109616 (2021).

G.E. Karniadakis et al., "Physics-informed machine learning," Nature Reviews 3, 422-440 (2021).

L. van Rueden et al., "Informed Machine Learning—A Taxonomy and Survey of Integrating Prior Knowledge into Learning Systems," arXiv preprint arXiv:1903.12394v3 (2021).

S. Cuomo et al., "Scientific Machine Learning through Physics-Informed Neural Networks: Where we are and What's next," arXiv preprint arXiv:2201.05624v2 (2022).

J. Degrave et al., "Magnetic control of tokamak plasmas through deep reinforcement learning," Nature 602, 414-433 (2022).

* cited by examiner

SYSTEMS AND METHODS FOR HIGH PRECISION OPTICAL CHARACTERIZATION OF CARRIER TRANSPORT PROPERTIES IN SEMICONDUCTOR MANUFACTURING

CROSS-REFERENCE TO RELATED PATENT APPLICATIONS

The present application is a continuation-in-part of U.S. patent application Ser. No. 17/149,303, filed Jan. 14, 2021, which is a continuation of application Ser. No. 15/855,142, filed Dec. 27, 2017, now U.S. Pat. No. 10,921,369, which has benefit of priority of U.S. Provisional Patent Application No. 62/498,685, filed Jan. 5, 2017, each of which are herein incorporated in their entireties by this reference.

BACKGROUND

Field of the Invention

The present invention relates to optical measurement of electronic transport properties in semiconductor manufacturing and, more particularly, to high precision measurement of carrier diffusion lengths, recombination lifetimes, diffusion coefficients, mobilities, and related carrier transport properties using photo-modulated reflectance techniques.

Background of the Invention

Semiconductor device performance depends fundamentally on the transport properties of electronic charge carriers within the semiconductor. In modern device manufacturing, many process steps have the potential to alter or degrade such carrier transport properties. Spatial and temporal shifts in process conditions cause variations in carrier transport properties, resulting in device timing variability and loss of manufacturing yield. This systematic type of variability is preferentially addressed through the application of "in-line" process control techniques, which require measurements directly on product wafers as they move through the manufacturing flow (i.e. between processing steps). Thus in-line process control is enabled by the ability to rapidly and non-destructively measure properties indicative of final device performance with micrometer scale spatial resolution.

Carrier transport properties are conventionally measured using four-point probe (4PP) and/or Hall effect techniques. Although these techniques have the requisite measurement capability, they are not suitable for in-line process control due to their destructive and time-consuming nature. At present, even the most advanced "micro-4PP" and "micro-Hall" techniques require contact with the sample. Such contact is disadvantageous in process control applications due to the possibility of particulate contamination.

Optical techniques are ideal for process control of semiconductor manufacturing as they are non-contact, can be performed rapidly, and provide micrometer scale resolution. For example, ellipsometry has been widely adopted in the semiconductor industry for the non-contact measurement of film thicknesses. Furthermore, numerous optical techniques have been developed for measurement of carrier transport properties. Surface photo-voltage (SPV), photo-conductance decay, free carrier absorption, photo-luminescence, and time resolved THz spectroscopy are among the techniques frequently reported in the prior art. However, in each case some particular feature of the technique presents a significant impediment to use for in-line process control. For example, the capacitive probes used in SPV techniques suffer from limited sensitivity (e.g. from stray capacitances) and poor spatial resolution. The spatial resolution of SPV limits its application to "at-line" process monitoring using unpatterned blanket wafers. Another optical technique, THz spectroscopy, is sensitive to carrier mobility but requires a complicated (and expensive) experimental setup. Thus at present there remains an outstanding need to rapidly and non-destructively measure carrier transport properties between processing steps.

The techniques disclosed herein generally utilize photo-modulated reflectance (PMR) techniques to characterize transport properties of electronic charge carriers. PMR techniques have been particularly important in basic research on semiconductors [F. H. Pollak, "Modulation Spectroscopy of Semiconductors and Semiconductor Microstructures," in *Handbook on Semiconductors*, Vol. 2, edited by M. Balkanski, pp. 527-635 (North-Holland, Amsterdam, 1994).]. The conventional PMR setup consists of an intensity modulated pump light beam used to modulate the reflectivity of the sample, a second continuous wave light beam used to probe the reflectance of the sample, an optical system for directing the pump and probe light beams to the sample, and for directing the reflected probe light onto a photodetector, and a signal processor to measure the differential reflectance. In general, the pump beam is used to modulate the free charge density in a semiconductor sample (i.e. via photo-injection), and hence modulate one or more physical quantities (such as, for example, near surface electric fields), thereby inducing a time periodic variation in the reflectivity of the sample. The pump light is typically modulated at a known frequency so that a phase-locked detection circuit may be used to suppress unwanted noise, resulting in the ability to detect reflectance changes at the ppm level. It may be appreciated that the pump beam in a PMR setup is analogous to the pump beam in a SPV or junction photo-voltage (JPV) measurement. The measured PMR signal is the relative change in the reflected probe light intensity as the intensity modulated pump radiation interacts with the sample and consists of a vector characterized by an amplitude and a phase. The normalized amplitude is the induced change in reflectance (AC) divided by the linear reflectance (DC), whereas the phase is the relative lag of the reflectance change with respect to the driving phase. This phase lag is due to the non-instantaneous relaxation dynamics of the charge carriers within the sample.

For probe beam wavelengths that are resonant with semiconductor interband transitions, the PMR signal arises from an electro-modulation effect (i.e. the Franz-Keldysh effect). This provides a means for optical detection of semiconductor bandstructure and internal electric fields through the appearance of sharp, third derivative spectra [D. E. Aspnes, "Linearized Third-Derivative Spectroscopy with Depletion-Barrier Modulation," *Phys. Rev. Lett.* 28, 913-916 (1972); D. E. Aspnes and J. E. Rowe, "Resonant Nonlinear Susceptibility: Electroreflectance in the Low-Field Limit," *Phys. Rev. B* 5, 4022-4030 (1972).]. Moreover, in accord with the Poisson relation, the experimentally measured PMR signal under such conditions is:

$$\Delta R/R = 2qN_e \Lambda(\lambda)/\varepsilon_s \times \Delta V, \quad (1)$$

where q is the electronic charge, $N_e$ is the active dopant concentration, $\Lambda(\lambda)$ is a third-derivative functional form determined by the semiconductor bandstructure ($\lambda$ is the probe beam wavelength), $\varepsilon_s$ is the static dielectric constant, and $\Delta V$ is the pump induced photo-voltage [N. Bottka et al., "Modulation Spectroscopy as a Tool for Electronic Material Characterization," *J. Electron. Mater.* 17, 161-170 (1988).]. Eq. (1) is valid for depleted surfaces provided the electric field is not too inhomogeneous [D. E. Aspnes and A. Frova, "Influence of Spatially Dependent Perturbations on Modulated Reflectance and Absorption of Solids," *Solid State Comm.* 7, 155-159 (1969). ("Aspnes 1969")].

The conventional analysis of spectroscopic PMR data involves the use of nonlinear regression techniques to adjust the variables within a parametrized third derivative functional form to provide an optimum fit to the data and to thereby determine semiconductor interband transition energies, widths, and/or amplitudes. Such nonlinear regression techniques generally define a "merit function" (sometimes also referred to as an "objective", "error", "cost", "loss", or "residual" function) which is used to quantify a "goodness-of-fit". If each data point has its own, known standard deviation, then the maximum likelihood estimate of the model parameters is obtained by minimizing the quantity known as the "chi-square" [W. H. Press et al., "Modeling of Data," in *Numerical Recipes in Fortran 77: The Art of Scientific Computing,* 2nd ed., pp. 650-700 (Cambridge University Press, New York, 1996).]. Considering a model that depends nonlinearly on a set of M unknown parameters $\alpha_k$, k=1, 2, . . . , M, and taking the derivative of chi-square with respect to the parameters $\alpha_k$ yields a set of M nonlinear equations for the M unknown parameters. Thus the basic nonlinear regression analysis is a minimization problem in M dimensions. The nonlinear regression analysis outputs the best-fit parameters, a statistical estimate of the error in the output parameters, and an overall "goodness-of-fit" measure. The error estimates generally depend upon (i) the measurement uncertainties at each data point, (ii) the number and spacing of the data points, and (iii) the match of the analytic model to the data. (Here, it may also be understood the term "nonlinear" as used in the phrase "nonlinear regression analysis" refers only to the analytic expression's dependence on its parameters.) As noted, the (third derivative) electro-modulation response is large only nearby strong optical absorptions in the semiconductor band structure and thus may be used to measure interband transition energies with excellent precision (typically $\approx$4 meV). In view of such precision, spectroscopic PMR analyses are also particularly useful to measure material composition and/or physical strain in semiconductors since interband transition energies shift under changes in composition and/or the application of strain. These features account for the historical importance of spectroscopic PMR in basic research on semiconductors.

More recently, PMR techniques using a monochromatic laser probe beam suitable for in-line process control applications have been developed [W. W. Chism, "Method of Photo-Reflectance Characterization of Strain and Active Dopant in Semiconductor Structures," U.S. Pat. No. 7,391,507, issued Jun. 24, 2008.]. For example, provided the probe beam wavelength is suitably chosen, the PMR signal is linearly proportional to the active dopant concentration, which is particularly convenient for control of advanced annealing processes in modern semiconductor manufacturing [W. Chism et al., "Photo-Reflectance Characterization of USJ Activation in Millisecond Annealing," *J. Vac. Sci. Technol. B* 28, C1C15-C1C20 (2010). ("Chism 2010")]. Moreover, since the photo-injected carriers will always reduce the latent voltage, the PMR signal reverses sign under a reversal of the surface polarity. Thus the sign of PMR signal may be used to infer which type of carrier is present. "Z-scan" PMR techniques, wherein the position of the sample surface is scanned through focus while spatial distortion of the reflected probe beam is analyzed via an aperture in the far field, have also been used to distinguish the refractive and absorptive components of the PMR signal [W. W. Chism, "Method and Apparatus of Z-scan Photoreflectance Characterization," U.S. Pat. No. 8,300,227, issued Oct. 30, 2012.]. In certain situations, the coherent wavefront of the laser probe beam may be used to isolate the refractive component of the PMR signal, greatly simplifying the data analysis [W. Chism and J. Cartwright, "Laser Photo-Reflectance Characterization of Resonant Nonlinear Electro-Refraction in Thin Semiconductor Films," *Thin Solid Films* 520, 6521-6524 (2012).].

Despite these advances, PMR is not widely used to determine electronic transport properties in semiconductor manufacturing. Rather, SPV and other aforementioned optical techniques are more commonly used for non-contact measurement of carrier transport properties. As noted, the pump beam in a PMR setup is analogous to the pump beam in a SPV or JPV measurement. Also, in accord with Eq. (1), the PMR signal is linearly proportional to the SPV ($\Delta V$). The SPV depends on the pump beam and the physics of its interaction with the sample [L. Kronik and Y. Shapira, "Surface photovoltage phenomena: theory, experiment, and applications," *Surf Sci. Rep.* 37, 1-206 (1999).]. Thus, determination of carrier transport properties from SPV measurements generally requires prior knowledge of the sample physics, e.g. pump absorption depth, surface and/or interface recombination velocities, etc. Moreover, only in certain limiting cases are the desired transport properties directly related to the measured quantities (SPV amplitude and phase). However, the SPV amplitude is generally linear in the pump intensity provided the photo-injection is small with respect to the restoring current [D. K. Schroder, "Carrier Lifetimes in Silicon," *IEEE Trans. Electron Devices* 44, 160-170 (1997); J. E. Park et al., "Silicon epitaxial layer lifetime characterization," *J. Electrochem. Soc.* 148, G411-G416 (2001). ("Park 2001")]. In this case the SPV will exhibit the spatial dependence of the excess carrier density. In the one-dimensional (1D) limit, the SPV may be obtained from the solution of the 1D differential equation for the modulated carrier density [D. K. Schroder, "Surface voltage and surface photovoltage: history, theory and applications," *Meas. Sci. Technol.* 12, R16-R31 (2001).]. In the three-dimensional (3D) limit, the excess carrier density with a Gaussian laser source involves a Gaussian weighted zero-order Hankel transform of the 1D solution and therefore must be treated numerically [J. Opsal et al., "Thermal-wave detection and thin-film thickness measurements with laser beam deflection," *Appl. Opt.* 22, 3169-3176 (1983).]. Thus in view of the appearance of the SPV in the PMR signal, the difficulties encountered in the use of SPV to determine carrier transport properties are likewise present in conventional PMR techniques.

However, as disclosed herein, use of laser beams for both the pump and probe in a PMR setup means the reflected probe beam may be treated directly according to the analytically tractable method of Gaussian decomposition [D. Weaire et al., "Effect of low-power nonlinear refraction on laser-beam propagation in InSb," *Opt. Lett.* 4, 331-333 (1979); M. Sheik-Bahae et al., "High-sensitivity, single beam $n_2$ measurements," *Optics Lett.* 14, 955-957 (1989); M. Sheik-Bahae et al., "Sensitive Measurement of Optical Nonlinearities Using a Single Beam," *IEEE J. Quant. Electron.* 26, 760-769 (1990); D. V. Petrov et al., "Reflection Z-scan technique for measurements of optical properties of surfaces," *Appl. Phys. Lett.* 65, 1067-1069 (1994).]. The numerical treatment required by the prior art in the 3D limit is thereby avoided. Moreover, as demonstrated herein, the analytic expression resulting from treatment by the method of Gaussian decomposition enables a nonlinear regression analysis to directly determine carrier transport properties without prior knowledge of the sample physics.

SUMMARY OF THE INVENTION

The present invention relates to methods for determining electronic transport properties in a semiconductor sample. More particularly, the present invention provides methods for the direct, high precision optical characterization of carrier diffusion lengths, recombination lifetimes, and/or diffusion coefficients using Z-scanning laser photo-modulated reflectance techniques. Once these carrier properties are measured, various additional electronic transport properties including the carrier mobility, the carrier effective mass, and the sheet resistance may be evaluated with high precision. Thus high precision optical characterization of carrier transport properties is achieved.

The methods disclosed herein generally utilize laser beams for both the pump and probe beams in a photo-modulated reflectance apparatus. The pump beam is an intensity modulated laser beam used to modulate the charge density in a semiconductor sample. In an exemplary embodiment, the pump beam induces a modulated excess carrier density within the sample within a radius of modulation $\omega_m = (\omega_p^2 + L^2)^{1/2}$, where $\omega_p$ is the pump beam radius and $L_d$ is the carrier diffusion length. In low injection, the induced photovoltage will exhibit the spatial dependence of the excess carrier density. Thus the spatial profile of the induced photovoltage depends on the carrier diffusion length. A second continuous wave laser beam is used to probe the change in reflectance of the sample as the intensity modulated pump radiation interacts with the sample. PMR signals are acquired as a function of the distance of the sample surface from the focal plane of the pump beam. As the sample is stepped through focus, the area of modulation varies according to the relation $\omega_m^2(Z) = \omega_p^2(Z) + L_d^2$, where Z is the distance from the pump beam waist to the sample surface and $\omega_p(Z)$ is the radius of the incident pump beam at the sample surface (i.e. $\omega_p^2(Z) = \omega_p^2[1 + (Z/z_p)^2]$, where $z_p = \pi\omega_p^2/\lambda_p$ is the Rayleigh range of the pump beam and $\lambda_p$ is the pump beam wavelength). The modulated component of the reflected probe beam is also a Gaussian beam with radius defined by the incident probe beam radius and the radius of modulation. The reflected probe beam is collected and input to the detector, thereby integrating over the transverse profile of the reflected probe beam. This spatial integration results in a simple analytic expression for the Z dependence of the PMR signal which depends solely on the focal parameters and the complex carrier diffusion length. The analytic expression enables a nonlinear regression analysis which outputs the carrier diffusion length, diffusion coefficient, and/or recombination lifetime, including error estimates on the output parameters, and a "goodness-of-fit" measure. Thus the numerical treatment required by the prior art is avoided by treating the reflected laser probe beam directly by the method of Gaussian decomposition. Moreover, as the complex diffusion length is the only sample parameter on which the Z profile of the PMR signal depends, the techniques disclosed do not require knowledge or interpretation of the physics underlying the PMR signal at Z=0.

A regressive fit to the PMR data is performed using a parametrized function wherein at least one carrier transport property is treated as a variable parameter. The error estimates on the output fit parameters depend upon the measurement uncertainties at each data point, the number and spacing of the data points, and the match of the analytic model to the data. The PMR measurement uncertainties approach the ppm level whereas the analytic model presented herein is broadly applicable. Thus in practice, the precision of the technique only depends upon the number and spacing of the data points in Z. In short, the analytic parametrization for the Z dependence of the PMR signal in terms of the complex diffusion length enables the direct, high precision determination of carrier diffusion lengths and/or recombination lifetimes using data obtained from a simple optical arrangement.

Once the diffusion length and recombination lifetime (and their estimated uncertainties) are known from the fit procedure, these carrier transport properties may be used to evaluate the diffusion coefficient, or equivalently, the carrier mobility (via the Einstein relation). Alternatively, low and high frequency PMR amplitude curves can be fit to obtain the carrier diffusion length and diffusion coefficient, respectively (which then may be used to evaluate the recombination lifetime). And once the mobility and the recombination time are known, the carrier effective mass may be evaluated. Similarly, once the mobility is known, it may be used in combination with the active dopant concentration in order to determine the sheet resistance (or equivalently, the sheet conductance). Thus the present disclosure describes the use of Z-scanning laser PMR techniques to rapidly, nondestructively and precisely characterize electronic transport properties including carrier diffusion lengths, recombination lifetimes, diffusion coefficients, mobilities, effective masses, and sheet resistances.

Furthermore, the Z-scanning laser PMR techniques disclosed here are fully applicable to PMR techniques which directly detect the excess carrier density (i.e. via the Drude effect). The experimentally measured PMR signal under such conditions is:

$$\Delta R/R = -q^2\lambda^2/2\pi^2\varepsilon_o n(n^2-1)mc^2 \times \Delta N, \quad (2)$$

where n is index of refraction, m is the carrier effective mass, and ΔN is the pump induced excess carrier density [R. E. Wagner and A. Mandelis, "A Generalized Calculation of the Temperature and Drude Photo-Modulated Optical Reflectance Coefficients in Semiconductors," *J. Phys. Chem. Solids* 52, 1061-1070 (1991).]. This Drude effect PMR signal is proportional to the square of the probe wavelength. Thus direct measurement of carrier modulation is preferred at longer wavelengths, such as, for example, in the near-TR. Such wavelengths generally penetrate far more deeply into the bulk and therefore do not provide the near surface specificity available when the wavelength of the probe is selected to coincide with interband transitions in the UV (i.e. such that the PMR signal arises from the Franz-Keldysh effect). Nevertheless, the ΔN factor present in the expression for the Drude effect PMR signal will exhibit the same spatial profile dependence on diffusion length as exhibited by the photo-voltage. In particular, the pump will induce an excess carrier density within the same radius of modulation as exhibited by ΔV. Thus the inventive techniques disclosed herein are fully applicable to PMR probe beam wavelengths selected to detect the excess carrier density via the Drude effect.

There has thus been outlined, rather broadly, certain features of certain embodiments in order that the detailed description thereof may be better understood, and in order that the present contribution to the art may be better appreciated. There are additional features in embodiments that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

DETAILED DESCRIPTION

The following discusses embodiments of systems and methods of Z-scanning laser photo-modulated reflectance characterization of electronic transport properties in semiconductors. It is to be understood that the embodiments of systems and methods of the present description may be used to determine electronic transport properties in any semiconductor, the discussion of exemplary silicon semiconductors considered to be exemplary only and in no way limiting in scope. It should be appreciated that the present embodiments provide numerous applicable inventive concepts that may be embodied in a variety of specific contexts. The specific embodiments discussed herein are merely illustrative of specific ways to make and/or use the invention and are not intended to limit the scope of the claims.

Figure 1:
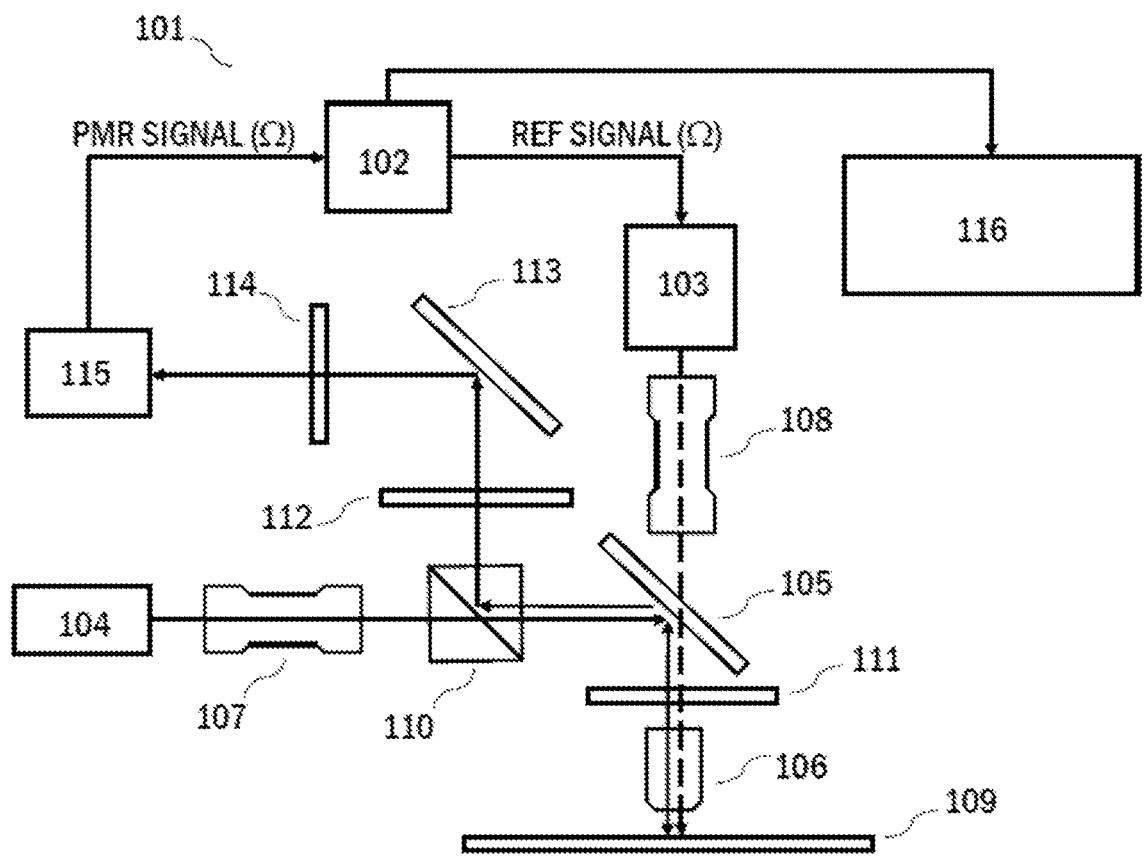
FIG. 1 illustrates an exemplary schematic laser PMR arrangement that may be used to perform Z-scanning laser PMR measurements, in accordance with certain embodiments of the present invention.

The present embodiments are based upon profiling of the output signals of a laser PMR system as the sample is stepped through focus. Exemplary embodiments discussed herein use laser beams having a cylindrically symmetric Gaussian intensity distribution for both the pump and probe beams in a PMR apparatus. However, as also discussed herein, the embodied techniques of the present disclosure may be accomplished with elliptical Gaussian profile beams or with any other beam profile which admits an analytic parametrization for the Z dependence of the PMR signal in terms of an electronic transport property of the sample. Likewise, it should be appreciated the embodied techniques of the present disclosure may be accomplished using a variety of focal geometries, including, for example, focusing the pump beam onto the sample at normal incidence while independently focusing the probe beam onto the sample with an oblique angle of incidence. As shown in FIG. 1, a system 101 that may be used to perform Z-scanning laser PMR measurements in accordance with the present invention comprises a lock-in amplifier 102, a pump laser 103, a probe laser 104, an optical system, which may comprise a dichroic beamsplitter 105, a microscope objective 106, a probe telescope 107, a pump telescope 108, a reflecting semiconductor sample 109, a polarization beamsplitter 110, a quarter wave plate 111, a color filter 112, a dielectric mirror 113, a collection lens 114, a photoreceiver 115, and a computer (or other controller) 116.

In an exemplary embodiment, the pump laser 103 intensity is directly modulated via reference signal from the lock-in amplifier 102. The pump amplitude may also be modulated by an external function generator, or by some other external means such as a chopper wheel fixtured in the pump beam path, with a reference signal supplied to the lock-in amplifier 102. Pump and probe beams (from the pump laser 103 and probe laser 104, respectively) are made collinear through the use of the dichroic beamsplitter 105 and co-focused to a point along the beam path using the microscope objective 106. The focal positions of the pump and probe beams are controlled with independent telescoping lens arrangements (107 and 108) in either input beam path, which may be automated. The collinear and co-focused pump and probe beams are directed to the semiconductor sample 109 using the microscope objective 106. The microscope objective 106 is mounted on a stage (not shown) effective to translate the microscope objective along the common beam path. The stage, which may be motorized and/or controlled by the computer/controller 116, provides for control of the displacement of the microscope objective 106 from the sample 109. As the pump radiation interacts with the sample 109, the sample 109 obtains a reflectance modulation, which results in changes in amplitude of the reflected probe light. The semiconductor sample 109 reflects the incident probe beam back through the microscope objective 106. The polarization beamsplitter 110, operating in conjunction with the quarter wave plate 111, is used to switch the probe beam reflected from the sample 109 out of the incoming probe beam path. The intensity of the pump and probe beams at focus may also be controlled via neutral density filters (not shown) fixtured in either input beam path. In order to remove any residual pump light and/or any photo-luminescence signal, the reflected probe beam is projected through the color filter 112 and/or onto the dielectric mirror 113. (Likewise, it may be appreciated any attendant photo-luminescence signal may be separated through the use of suitable dielectric mirrors and/or color filters and analyzed in accord with techniques known in the art.) The reflected probe beam is collected at the collection lens 114 and input to the photoreceiver 115, thereby integrating over the radial profile of the beam. The resulting Z dependence of the modulated reflectance depends solely on the focal parameters and the complex carrier diffusion length. The photoreceiver 115 output signal (voltage or current) is passed to the lock-in amplifier 102, which measures the PMR signal. The PMR signal is the relative change in the total reflected probe light intensity and consists of a vector characterized by an amplitude and a phase. The microscope objective 106 is stepped through sequence of positions with respect to the sample 109 surface. At each position, the PMR signal is measured and transmitted to the computer/controller 116, which records the PMR signal as function of Z. The computer/controller 116 may also be used to perform a nonlinear regression analysis to determine an electronic transport property of the sample 109 as described hereinafter.

Figure 2:
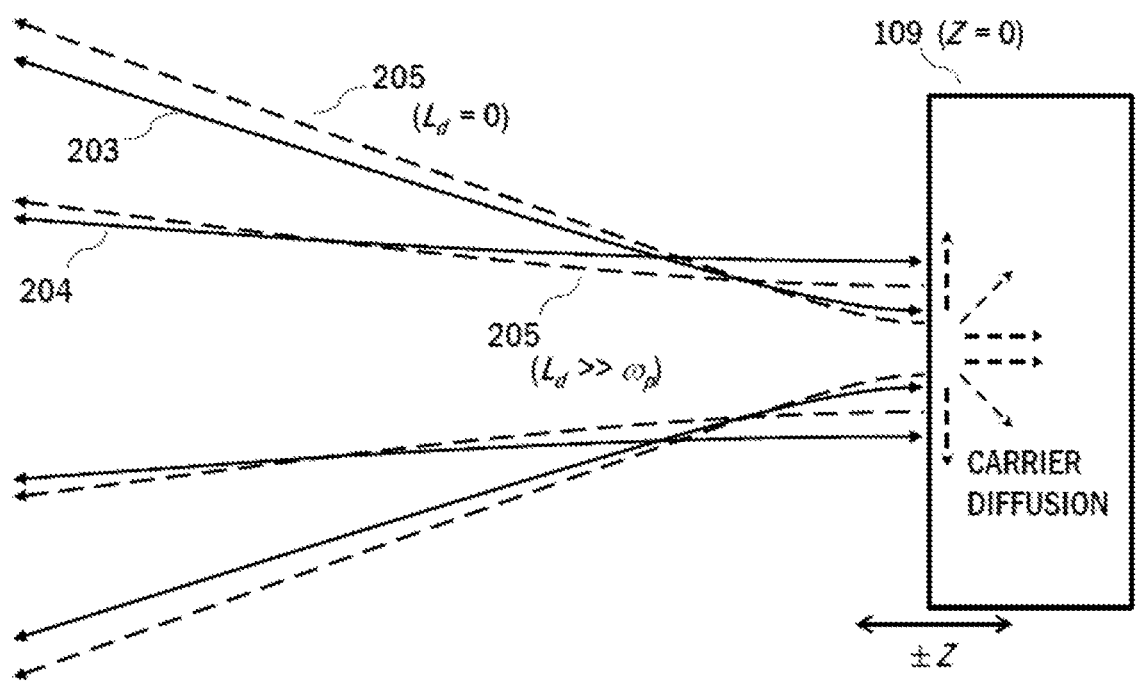
FIG. 2 illustrates an exemplary focal geometry of the pump and probe (both incident and reflected) beams at Z=0, in which exemplary profiles of the reflected AC probe beam for different values of $L_d$ are also shown, in accordance with certain embodiments of the invention.

In an exemplary embodiment, the pump and probe beams are cylindrically symmetric and directed at normal incidence onto the sample 109. The distance between the common beam waist and the sample surface is Z. The focal geometry of the incident pump and probe beams at Z=0 is illustrated in FIG. 2. At focus, the linear reflected pump and probe beam profiles (203 and 204, respectively) will coincide with their respective input beams. As noted, the pump beam will induce a reflectance modulation within a radius $\omega_m = (\omega_p^2 + L_d^2)^{1/2}$. As the pump beam is stepped through focus, the area of modulation varies according to the relation $\omega_m^2(Z) = \omega_p^2(Z) + L_d^2$. The Fresnel coefficient for the reflected probe beam includes the changes due to pump-induced energy transformation processes. The mirror-reflected probe beam amplitude may be expanded as a sum of Gaussian beams of decreasing waist. In particular, given a dominant photovoltage effect according to Eq. (1), and retaining only two terms in the expansion, the electric field of the reflected probe laser beam at the surface of the sample may be written (disregarding the common spatial phase):

$$E_r = E_o \omega_o/\omega(Z) \times \exp\{-\rho^2/\omega^2(Z)\} \times [r + \partial r/\partial n \times (n_2 + i k_2) \\ I_p \omega_m^2/\omega_m^2(Z) \times \exp\{-2\rho^2/\omega_m^2(Z)\}], \quad (3)$$

where $|E_o|^2$ is the intensity of the probe beam at focus, $\omega_o$ is the probe beam waist (i.e. $\omega(Z) = \omega_o[1 + (Z/z_o)^2]^{1/2}$, where $z_o = \omega_o^2/\lambda$ is the Rayleigh range of the probe beam), $\rho$ is the radial distance as measured from the probe beam axis, r is the complex reflectance coefficient, n is the index of refraction of the sample, $n_2$ and $k_2$ are effective nonlinear indices defined by the coefficients appearing in Eq. (1), $I_p$ is the intensity of the pump beam at focus, and $\omega_m(Z)$ is the radius of modulation as previously defined. The leading term corresponds to the DC component of the reflected probe beam whereas the second term corresponds to its modulated component. The broadening of the pump source by carrier diffusion is explicit in the factors $\omega_m$ and $\omega_m(Z)$ appearing in the second term. The modulated component of the reflected probe beam is also a Gaussian beam with radius defined by the incident probe beam radius and the radius of modulation. At each value of Z the reflected AC probe beam component retains a Gaussian form with a smaller effective waist. FIG. 2 also shows the reflected AC probe beam profile 205 for different values of $L_d$. When $L_d \cong 0$, the waist of AC reflected probe beam is smaller than that of either the pump or the probe beam. However, when $L_d^2 \gg \omega_p^2$ the AC reflected beam 205 will approach the reflected DC profile. Thus the profile of the AC reflected probe beam is dependent upon the diffusion length. In the case of a dominant Drude effect, the expression for the mirror-reflected probe beam field at the surface is of precisely the same form as Eq. (3), the only distinction being that the effective nonlinear indices $n_2$ and $k_2$ are now defined by the coefficients appearing in Eq. (2).

Squaring the mirror-reflected probe field and integrating over the beam profile yields the spatially integrated (or "total") PMR signal via the identity:

$$1 + \Delta R/R = [\int_0^\infty |E_r|^2 \rho d\rho]/[\int_0^\infty |E_{dc}|^2 \rho d\rho], \quad (4)$$

where $E_{dc}$ is just the linear reflectance amplitude. Neglecting terms of second order in the nonlinear indices and performing the spatial integrations in Eq. (4), the total PMR signal may be written:

$$\Delta R/R = 4 n_2 I_p/(n^2 - 1) \times (\omega_p^2 + L_d^2)/(\omega^2(Z) + \omega_p^2(Z) + L_p^2), \quad (5)$$

where $n^2 \gg k^2$. The key observation here is that the Z dependence of the total PMR signal is contained entirely within the denominator of Eq. (5). Moreover, if $\omega_o^2 + \omega_p^2 \leq L_d^2$, the 3D limit will be approached for Z=0 [J. Opsal et al., "Temporal behavior of modulated optical reflectance in silicon," *J. Appl. Phys.* 61, 240-248 (1987).]. However, well away from Z=0 (i.e. where $\omega^2(Z) + \omega_p^2(Z) \leq L_d^2$), the 1D limit is restored. (Note Eq. (3) is valid in the 3D limit. Thus the treatment by the method of Gaussian decomposition smoothly interpolates between the 3D and 1D limits.) Accordingly, the appearance of $L_d^2$ in the denominator of Eq. (5) shows the Z dependence of the total PMR signal will depend strongly on diffusion length provided the pump and probe beam waists are commensurate with $L_d$.

Furthermore, at "intermediate" modulation frequencies where the recombination lifetime is comparable to the modulation period (i.e. $\Omega\tau \sim 1$, where $\Omega$ is the modulation frequency in radians per second and $\tau$ is the recombination lifetime), $\tau$ likewise becomes coupled into the Z dependence of the total PMR signal through the appearance of the complex diffusion length $L_d \rightarrow L_d/(1+i\Omega\tau)^{1/2}$. In particular, Eq. (5) demonstrates that the total PMR signal as a function of Z may be parametrized by the expression:

$$\Delta R/R = A \exp\{i\phi_o\}/[\omega^2(Z) + \omega_p^2(Z) + L_d^2/(1+i\Omega\tau)], \quad (6)$$

where A and $\phi_o$ are the Z independent PMR amplitude and phase, respectively. Remarkably, the dependencies of the PMR signal on various parameters such as pump absorption depth and surface or interface recombination velocities are absorbed into A and $\phi_o$. Thus the Z dependence of the total PMR signal is independent of the various parameters which determine the PMR amplitude and phase at Z=0. Thus the embodiments disclosed here do not require prior knowledge of such parameters or how they enter into the total PMR signal.

For an analogous optical configuration with elliptical pump and probe beams, the analog of Eq. (6) becomes:

$$\Delta R/R = A \exp\{i\phi_o\}/[\omega_x^2(Z) + \omega_{px}^2(Z) + L_x^2/(1+i\Omega\tau)]^{1/2} \\ [\omega_y^2(Z) + \omega_{py}^2(Z) + L_y^2/(1+i\Omega\tau)]^{1/2},$$

where x and y refer to the elliptic axes. This analytic expression follows from the generalization of Eq. (3) to the case of elliptic Gaussian beams, as may be understood by reference to A. YARIV, "The Propagation of Optical Beams in Homogeneous and Lenslike Media," in Quantum Electronics, 3rd ed., pp. 106-133 (Wiley, New York, 1989), at pp. 129-130, in further view of the derivation of Eq. (6) as discussed above. In the case with carrier diffusion in effectively only one direction along the sample surface, for example a spatially periodic array of nanometer-width semiconductor lines such that, e.g., $L_x \to 0$, the elliptical analog of Eq. (6) further reduces to:

$$\Delta R/R = A \exp\{i\phi_o\}/[\omega_x^2(Z)+\omega_{px}^2(Z)]^{1/2}[\omega_y^2(Z)+\omega_{py}^2(Z)+L_y^2/(1+i\Omega\tau)]^{1/2}.$$

This analytic expression is similar to Eq. (6), but with the appearance of (i) a square root on the diffusion dependent factor, and (ii) an additional amplitude dependence on the focal parameters (i.e., $A \to A/[\omega_x^2(Z)+\omega_{px}^2(Z)]^{1/2}$). (As may be appreciated, a wide line focus along the x direction may be chosen to mitigate such amplitude dependence.)

In further view of Eq. (6) and/or its analogs, it may be appreciated that the optical system may utilize an electrically tunable liquid lens to translate the focal plane of either laser beam with respect to the sample surface. For example, an electrically tunable liquid lens fixtured in the common input beam path (i.e. after the pump and probe beams are made collinear, but before they are input to the microscope objective) may be used to translate the common focal plane without translating the microscope objective. Similarly, an electrically tunable liquid lens fixtured in the pump telescoping arrangement may be used to independently translate the focal plane of the pump laser beam while holding the microscope objective fixed (i.e. such that $\omega^2(Z)=\omega_o^2$). Alternatively, an electrically tunable liquid lens fixtured in the probe telescoping arrangement may be used to maintain $\omega^2(Z) \approx \omega_o^2$ while the microscope objective is translated. Such modifications to the exemplary optical configuration and/or its attendant manner of operation which retain the fundamental dependence of the PMR signal on the complex diffusion length, as taught or suggested by Eq. (6) and/or its analogs, are therefore properly understood as falling within the scope of the embodiments.

In any such suitable embodiment, the coupling of the complex diffusion length into the Z dependence of the total PMR signal indicates that $L_d$, and ultimately $\tau$, may be determined by a regressive fit to the experimental Z-scan PMR data. For example, according to Eq. (6), the Z dependence of the PMR amplitude may be parametrized by the expression:

$$|\Delta R/R| = A/[L_d^4 + 2L_d^2\{\omega^2(Z)+\omega_p^2(Z)\} + \{\omega^2(Z)+\omega_p^2(Z)\}^2(1+\Omega^2)]^{1/2}, \quad (7)$$

whereas the Z dependence of the PMR phase may be parametrized by the expression:

$$\phi = \phi_o + \tan^{-1}\{L_d^2\Omega\tau/[L_d^2+\{\omega^2(Z)+\omega_p^2(Z)\}(1+\Omega^2\tau^2)]\}. \quad (8)$$

Thus the Z dependence of the PMR amplitude may be parametrized by the set of variables: A, $L_d^2$, $\omega_p^2$, $\omega_o^2$, and $\Omega\tau$, whereas the corresponding phase expression allows analytic parametrization using the variables: $\phi_o$, $L_d^2$, $\omega_p^2$, $\omega_o^2$, and $\Omega\tau$. (Note that $\Omega$, $\omega_o$, and $\omega_p$ are system parameters, whereas A, $\phi_o$, $L_d^2$, and $\tau$ are sample parameters. For analysis purposes, the system parameters may be treated as fixed parameters, whereas the sample parameters may be treated as variable parameters to be resolved by the fit procedure.) A nonlinear regression analysis can then be used to adjust the variables within the appropriate parametrized expression to provide an optimum fit to the PMR phase and/or amplitude data. For example, the well-known Levenberg-Marquardt method may be used to adjust the variables within a nonlinear equation of the form of Eq. (7) in order to establish the carrier diffusion length and its estimated uncertainty.

It is to be appreciated the fit procedure is performed by a computer program, embodied on a non-transitory computer readable medium (including any medium that facilitates transfer of a computer program from one location to another), comprising executable code effective to receive PMR amplitude and/or phase data acquired as a function of Z, system parameters (such as modulation frequency, focal parameters, etc.), and initial guesses for variable parameters, to perform the nonlinear regression analysis, and to output the best-fit parameters, a statistical estimate of the error in the output parameters, and an overall "goodness-of-fit" measure, as necessary. Thus computer program residing on a physically separated computer, a remote server, or the like, may be used to perform the nonlinear regression analysis in accord with the embodiments, such use falling within the scope of the disclosure.

At intermediate frequencies, we have a pair of nonlinear equations, containing a number of common variables, from which we attempt to extract two variables (i.e. $L_d$ and $\tau$). The parameters A, $L_d^2$, and $\Omega\tau$ are generally correlated within the amplitude fit while the parameters $\phi_o$, $L_d^2$, and $\Omega\tau$ are generally correlated in the phase fit. However, the expression for the amplitude has strong dependence upon $L_d$, but only minimal dependence upon $\Omega\tau$. On the other hand, the expression for the phase is strongly dependent upon $\Omega\tau$ (i.e. via the argument of the arctangent appearing in Eq. (8)). Accordingly, the decomposition of Eq. (6) into simultaneous equations for amplitude and phase allows an iterative fit procedure (with the estimated uncertainties output from a standard nonlinear least-squares minimization procedure).

First, in order to provide an initial estimate of $L_d^2$, a conventional nonlinear least-squares procedure may be used to adjust the parameters of Eq. (7), while holding $\Omega\tau$ constant (~1), to provide an optimized fit to the Z-scanning PMR amplitude data. An exemplary FORTRAN subroutine which may be used to adjust the parameters of Eq. (7) while holding $\Omega\tau$ constant is as follows:

```
SUBROUTINE funcs(x,a,y,dyda,na)
INTEGER na
REAL x,y,a(na),dyda(na)
REAL PI, WT, LPU, LPR, DPU, DPR, WBD2, DENOM
PI=4.0*ATAN(1.0)
WT=0.87338
LPU=.488
LPR=.375
DPU=x-a(5)
DPR=x-a(6)
WBD2=a(2)*(1.0+(LPU*DPU/PI/a(2))**2)
WBD2=a(4)*(1.0+(LPR*DPR/PI/a(4))**2)+WBD2
DENOM=WBD2**2*(1.0+WT**2)
DENOM=a(3)**2+2.*a(3)*WBD2+DENOM
y=a(1)/SQRT(DENOM)+a(7)
dyda(1)=1./SQRT(DENOM)
dyda(3)=-a(1)/DENOM**1.5*(a(3)+WBD2)
dyda(2)=-a(1)/DENOM**1.5*(a(3)+WBD2*(1.+WT**2))
dyda(4)=dyda(2)*(1.0-(LPR*DPR/PI/a(4))**2)
dyda(2)=dyda(2)*(1.0-(LPU*DPU/PI/a(2))**2)
dyda(5)=2.*a(1)/DENOM**1.5*(a(3)+WBD2*(1.+WT**2))
dyda(6)=dyda(5)*DPR/a(4)*(LPR/PI)**2
dyda(5)=dyda(5)*DPU/a(2)*(LPU/PI)**2
dyda(7)=1.0
return
END
``` where $x \equiv Z$, $y \equiv |\Delta R/R|$, $a(1) \equiv A$, $a(2) \equiv \omega_p^2$, $a(3) \equiv L_d^2$, $a(4) \equiv \omega_o^2$, $a(5)$ and $a(6)$ are the positions of pump and probe beam waists, respectively, and $a(7)$ is a constant offset. Note here $\Omega\tau$ ("WT") is held explicitly constant. However, it should be appreciated a nonlinear equation of the form of Eq. (7) may include $\Omega\tau$ as a variable fit parameter.

Next, holding $L_d^2$ constant at its value as output from the amplitude fit, a conventional nonlinear least-squares procedure may be used to adjust the parameters of Eq. (8) to provide an optimized fit to the Z-scanning PMR phase data. Then the output value for $\Omega\tau$ may be held constant in the amplitude fit in order to improve the estimate of $L_d^2$. This procedure can be iterated, holding each $L_d^2$ output from the amplitude fit constant in the subsequent phase fit, and each $\Omega\tau$ as output from the phase fit constant in the subsequent amplitude fit, until $L_d^2$ and $\Omega\tau$ approach limiting values. The amplitude and phase fits may also be used to provide estimated statistical uncertainties in $L_d^2$ and $\Omega\tau$, respectively. The PMR measurement uncertainties approach the ppm level whereas Eqs. (7) and (8) are broadly applicable. Therefore, in practice, the estimated uncertainties of the output fit parameters depend primarily upon the number and spacing of the data points in Z. Thus the polar form provides an advantageous means to determine $L_d$ and $\tau$ with high precision.

Although the exposition herein proceeds from the polar representation of the PMR data, i.e. involving amplitude and phase fits, it may be appreciated a rectangular representation may be used to the equivalent effect (namely the precise determination of carrier transport properties from Z-scan PMR data). In particular, the PMR vector is commonly represented in the form X+iY (X and Y are referred to as the "in-phase" and "quadrature" components of the PMR signal, respectively), which is convenient for complex nonlinear least squares optimization. In complex nonlinear least squares optimization, the conventional chi-square objective function is modified to simultaneously fit to the real (in-phase) and imaginary (quadrature) components of the data, yielding a single set of parameter estimates [B. A. BOU-KAMP, "A Nonlinear Least Squares Fit Procedure for Analysis of Immittance Data of Electrochemical Systems," Solid State Ionics 20, 31-44 (1986); J. R. MACDONALD and L. D. POTTER, JR., "A Flexible Procedure for Analyzing Impedance Spectroscopy Results: Description and Illustrations," Solid State Ionics 23, 61-79 (1987); J. R. MACDONALD, "Comparison and application of two methods for the least squares analysis of immittance data," Solid State Ionics 58, 97-107 (1992); M. ZIC, "An alternative approach to solve complex nonlinear least squares problems," J. Electroanal. Chem. 760, 85-96 (2016)]. Indeed, the ability to compare the results of separate complex, real, imaginary, amplitude and/or phase fits is well known in the art [LEVM/LEVMW Manual, "CNLS (Complex Nonlinear Least Squares) Immittance, Inversion, and Simulation Fitting Programs for WINDOWS and MS-DOS," Version 8.12, published by J. R. MACDONALD, June 2013.]. Such modifications to the exemplary fit procedure are therefore properly understood as falling within the scope of the disclosure.

In order to demonstrate the Z-scanning laser PMR technique, a set of silicon samples with various p-type shallow junction structures were evaluated. These samples were selected primarily because they were processed using process conditions encountered in advanced silicon device manufacturing. The large number of samples, all exhibiting large PMR signals, were also convenient to demonstrate the technique and its practicality. The shallow junctions were formed in silicon (100) substrates by implantation of n-type dopant (As) followed by low-energy high-dose B implantation. Dopant activation was performed using millisecond timescale flash-lamp based annealing. A range of base temperature and flash temperature targets were used to study dopant activation, dopant diffusion, and material quality. The process conditions studied included: (i) flash target temperatures in the 1250-1350° C. range, (ii) an additional thermal annealing of the As counter doped layer prior to B implantation, and (iii) use of a Ge amorphizing implant (AI) to reduce B ion channeling. The AI process introduces a layer of crystalline defects close to the sample surface. These defects reduce the carrier diffusion length and recombination time in the implanted region. SIMS data indicated post-activation B doping levels of $\approx 1\times 10^{19}$/cc at junction depths $X_j$=20 nm across the sample set. The voltages across the ultra shallow junctions are relatively large, on the order of several volts, and may be estimated from the conventional 1D Poisson analysis (which also provides the electric fields). A sketch of the pump-on/pump-off carrier flows in the normal direction is shown in FIG. 1 of Chism 2010. While these carrier flows dramatically affect the values A and $\phi_o$, it is to be emphasized the determination of electronic transport properties from Z-scan PMR profiles as disclosed here does not require prior knowledge of A or $\phi_o$.

The Z-scanning laser PMR measurement system was configured with pump and probe beams generated from the output of semiconductor diode lasers. The pump beam generally comprises a laser output with at least one photon energy greater than the smallest interband transition energy of a semiconductor material within the sample. Generally, the probe beam may comprise a laser output with at least one photon energy effective to directly detect the modulated photovoltage induced by the pump, or may comprise a laser output with a least one photon energy effective to directly detect the excess carrier density generated by the pump. The pump and probe beam wavelengths were 488 and 375 nm, respectively. This probe beam wavelength is near the lowest energy direct interband transition in Si, resulting in a dominant photovoltage effect. The 375 nm probe light has an absorption depth in Si $\delta\approx 23$ nm. Therefore, in this embodiment, any detected photo-voltage necessarily occurs at or near the surface (see e.g., Eq. (7) of Aspnes 1969). The pump and probe beams were made collinear by use of a dichroic beamsplitter and were co-focused to a micrometer scale spot on the surface of each sample. As noted, the pump and probe beam waists are selected to be commensurate with the diffusion lengths to be measured. However, as may be appreciated, carrier diffusion lengths vary widely depending on semiconductor materials, crystallinity, dopant concentrations, and surface conditions. For example, the diffusion length of carriers in crystalline Si varies from $\sim 10^{-1}$ cm to $\sim 10^{-5}$ cm as the doping density varies from $\sim 10^{15}$/cc to $\sim 10^{20}$/cc. In situations where the diffusion length is large the modulation frequency may be selected such that $\Omega\tau\geq 1$, which provides a means to maintain the diffusion length commensurate with the pump and probe beam waists.

The pump laser output was directly modulated via a reference signal from the lock-in amplifier. In general, the phase in a modulated photovoltage measurement will exhibit an arctangent dependence approaching zero for $\Omega\tau\leq 1$, and $-\pi/2$ for $\Omega\tau\geq 1$. Therefore, in the intermediate regime ($\Omega\tau\sim 1$), the phase will transition, almost linearly, from $\approx 0°$ to $\approx -90°$ (see e.g., FIGS. 8, 13, 16 and/or 17 of Park 2001). For each of the wafers used in this study, this linearity was confirmed over the frequency range 600-900 kHz. Thus an optimal modulation period of 750 kHz was selected.

In general, the modulation frequency is dictated by the carrier recombination lifetime and the transport property to be measured. For example, the diffusion length may be accessed directly by setting the modulation frequency such that $\Omega\tau\approx 0$ (i.e. low frequency), such that the amplitude reduces to $|\Delta R/R| \approx A/[L_d^2+\omega^2(Z)+\omega_p^2(Z)]$. Then we have one nonlinear equation, containing a number of known system parameters, from which we may evaluate $L_d$. Similarly, the diffusion coefficient D may be accessed directly by setting the modulation frequency such that $\Omega\tau \gg 1$, such that the recombination time is eliminated (i.e. for $\Omega\tau \gg 1$, the amplitude reduces to $|\Delta R/R| \approx A/[(D/\Omega)^2 + \{\omega^2(Z) + \omega_p^2(Z)\}^2]^{1/2}$). Thus, at high frequencies, the amplitude equation may be used to evaluate D, or equivalently, the mobility (via the Einstein relation $\mu = qD/k_BT$, where $k_BT$ is the thermal voltage ($\approx 26$ meV)). The combination of high and low frequency Z-scan PMR data may also be used to determine the recombination time via the relation $\tau = L_d^2/D$, where $L_d$ and D are determined from low and high frequency analyses, respectively. Furthermore, in practice, the recombination lifetime may be accessed directly by setting the modulation frequency such that $\Omega\tau \sim 1$ (i.e. intermediate frequency), such that Eq. (8) may be used in a nonlinear regression analysis in order to evaluate $\tau$. An example FORTRAN subroutine which may be used in nonlinear least-squares minimization of Eq. (8) is as follows:

```
SUBROUTINE funcs(x,a,y,dyda,na)
INTEGER na
REAL x,y,a(na),dyda(na)
REAL PI, LPU, DPU, LPR, DPR, WBD2, DENOM
PI=4.0*ATAN(1.0)
LPU=.488
LPR=.375
DPU=x-a(5)
DPR=x-a(6)
WBD2=a(2)*(1.0+(LPU*DPU/PI/a(2))**2)
WBD2=a(4)*(1.0+(LPR*DPR/PI/a(4))**2)+WBD2
DENOM=a(3)+WBD2*(1.0+a(7)**2)
y=ATAN(a(3)*a(7)/DENOM)+a(1)
dyda(1)=1.
dyda(3)=a(7)/(DENOM**2+(a(3)*a(7))**2)*WBD2*(1.0+a(7)**2)
dyda(2)=-a(3)*a(7)/(DENOM**2+(a(3)*a(7))**2)*(1.0+a(7)**2)
dyda(4)=dyda(2)*(1.0-(LPR*DPR/PI/a(4))**2)
dyda(2)=dyda(2)*(1.0-(LPU*DPU/PI/a(2))**2)
dyda(5)=2.*a(3)*a(7)
dyda(5)=dyda(5)/(DENOM**2+(a(3)*a(7))**2)*(1.0+a(7)**2)
dyda(6)=dyda(5)*DPR/a(4)*(LPR/PI)**2
dyda(5)=dyda(5)*DPU/a(2)*(LPU/PI)**2
dyda(7)=a(3)/(DENOM**2+(a(3)*a(7))**2)
dyda(7)=dyda(7)*(a(3)+WBD2*(1.0-a(7)**2))
return
END
``` where $x \equiv Z$, $y \equiv \phi$, $a(1) \equiv \phi_o$, $a(2) \equiv \omega_p^2$, $a(3) \equiv L_d^2$, $a(4) \equiv \omega_o^2$, $a(5)$ and $a(6)$ are the positions of pump and probe beam waists, respectively, and $a(7) \equiv \Omega\tau$.

As may be appreciated, carrier recombination lifetimes vary widely depending on semiconductor materials, crystallinity, dopant concentrations, and surface conditions. For example, the recombination lifetime of carriers in crystalline Si varies from $\sim 2 \times 10^{-4}$ s to $\sim 10^{-9}$ s as the doping density varies from $\sim 10^{15}$/cc to $\sim 10^{20}$/cc. Maintaining the criteria $\Omega\tau \sim 1$ over such a range of recombination lifetimes requires modulation frequencies ranging from $\sim 1$ kHz to $\sim 160$ MHz. These frequency ranges are accessible with wide bandwidth lock-in amplifiers such as the Signal Recovery model 7280 (operable from ½ Hz to 2 MHz), or the Stanford Research models SR860 (operable from 1 mHz to 500 kHz), SR865A (operable from 1 mHz to 4 MHz), and SR844 (operable from 25 kHz to 200 MHz). As can be appreciated, such wide bandwidth lock-in amplifiers may provide access to the low and high frequency ranges as well.

The pump and probe beam waists were overlapped via telescoping arrangements configured in the input arms of either beam. The entire reflected probe beam was collected and directed into a photoreceiver, thus radially integrating the beam. The photoreceiver was a high-speed UV enhanced silicon photo-diode connected to a trans-impedance amplifier circuit. As may be appreciated, it is advantageous to keep the probe intensity at a minimum, since any photo-injection of electron-hole pairs from the probe will necessarily offset the sample baseline condition (e.g. by reducing the latent field). Likewise, any CW component of the pump is undesirable. Excessive pump and probe beam intensities may be avoided via neutral density filters fixtured in the input arms of either beam. For the exemplary samples used here the photo-injected carrier density was maintained in low-injection ($\Delta N/N_e \ll 1$). However, if the probe intensity is too low, detection may not be possible with conventional photodiodes. Thus photoreceiver embodiments include an avalanche photo-diode (APD) connected to an amplifier circuit such as, for example, the Hamamatsu model C12703 high-gain APD module configured with the Hamamatsu model S5344 short wavelength APD. Photoreceiver embodiments may also include a photomultiplier tube connected to an amplifier circuit. The photoreceiver output was passed to the lock-in amplifier, which measured the amplitude and phase of the reflectivity change. This information was transmitted to the computer/controller, which records the components of the differential change in reflectivity vector as a function of Z. Thus Z-scanning PMR data was acquired on the exemplary samples.

Figure 3:
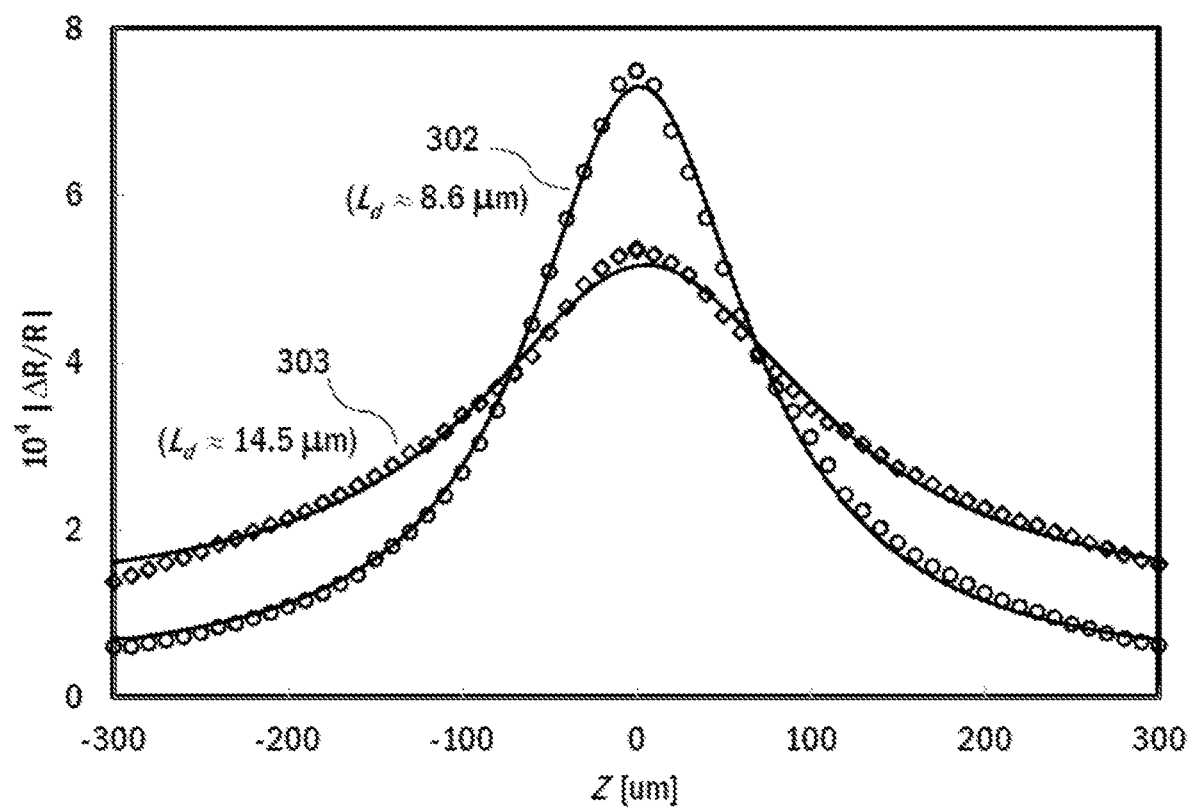
FIG. 3 illustrates exemplary Z-scanning laser PMR amplitude data and fits illustrating the effect of near surface damage on carrier diffusion length in shallow electrical junctions formed in silicon, in accordance with certain embodiments of the invention.
Figure 4:
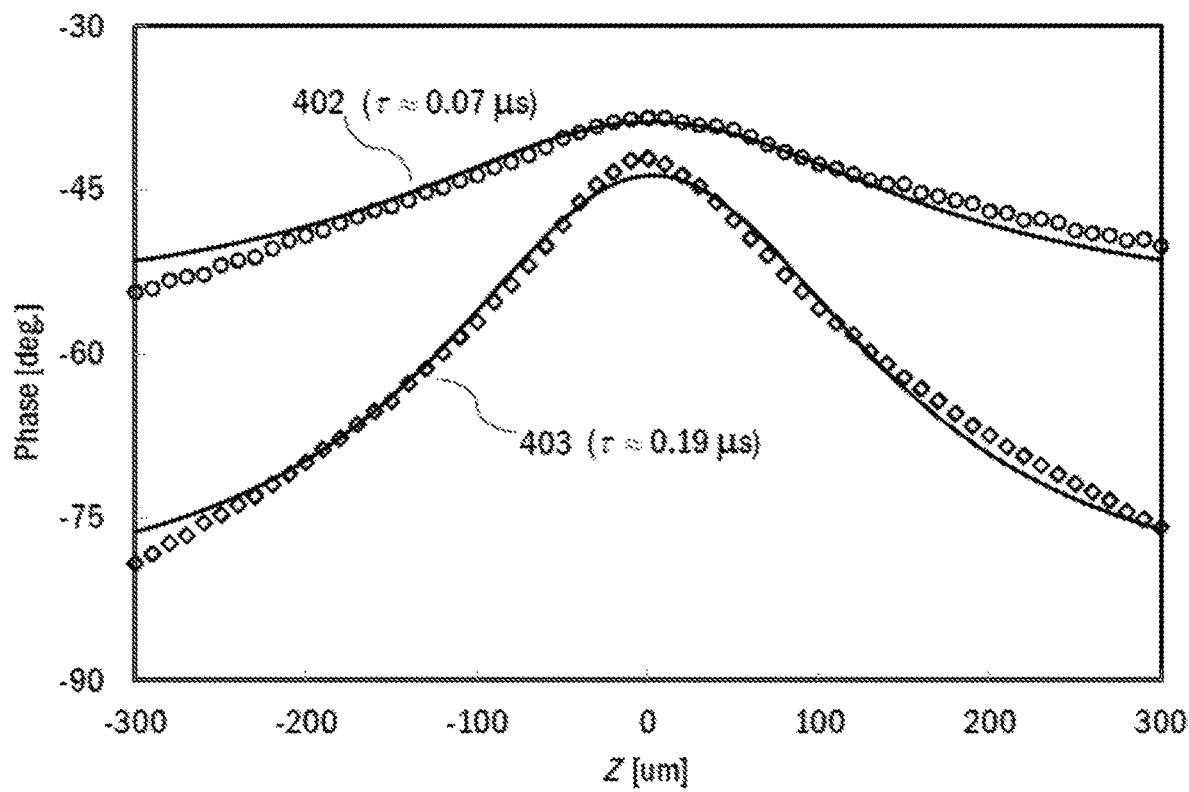
FIG. 4 illustrates exemplary Z-scanning laser PMR phase data and fits generated from the same pair of samples as shown in FIG. 3, illustrating the effect of near surface damage on carrier recombination lifetime in shallow junctions, in accordance with certain embodiments of the invention.

Estimates for $\Omega\tau$ were obtained via regressive fitting to the acquired phase data. Then $\Omega\tau$ was fixed in regressive fits to the acquired amplitude data in order to yield $L_d^2$. The estimated uncertainties in the extracted parameters were also output from the fitting procedure. FIG. 3 shows experimental Z-scan PMR amplitude data and fits obtained from samples with and without AI (302 and 303, respectively). The amplitudes are symmetric with respect to Z, as anticipated. The PMR amplitude from the sample without AI 303 shows a relatively broad Z profile, whereas the data from the sample with AI 302 exhibits a narrower profile. The more sharply peaked PMR amplitude as a function of Z seen on the sample with AI evidences a shorter diffusion length. This behavior was apparent in the amplitude data for all samples that received the AI process, as expected. Likewise, FIG. 4 shows experimental Z-scan PMR phase data and fits obtained from the same pair of samples as shown in FIG. 3 (402 and 403, respectively). The phases are again symmetric with respect to Z, in accord with Eq. (8). The observed phase lag of approximately $-45°$ confirms operation in the intermediate frequency regime. The broader PMR phase as a function of Z seen on the sample with AI 402 evidences a shorter recombination lifetime. The more sharply peaked amplitude data 302 corresponds to the broader phase data 402, demonstrating carrier relaxation in the sample with AI happens more quickly and occurs over a shorter range than in the sample without AI. This behavior was apparent in the phase data for all samples that received the AI process, as expected. The remarkable impact of near surface damage on the Z-scan profile, as seen in FIGS. 3 and 4, demonstrates the embodiment discussed here is primarily sensitive to carrier electronic parameters within the absorption depth of the probe. (This near-surface specificity is a key advantage in semiconductor manufacturing.) The mobility and its estimated uncertainty were obtained from the extracted parameters via the Einstein relation. Table 1 lists fitted values of diffusion length, recombination time, and mobility for the subset of samples with AI, assuming a measurement uncertainty of 2 ppm for the PMR amplitude and 0.13° for the PMR phase.

TABLE 1

| Flash temp [° C.] | $L_d$ [μm] | | τ [ns] | | μ [cm²/V · s] | |
|---|---|---|---|---|---|---|
| | Flash only | Pre-soak | Flash only | Pre-soak | Flash only | Pre-soak |
| 1300/550 | 6.07 ± .02 | 6.01 ± .02 | 90.5 ± .5 | 87.6 ± .6 | 157 ± 2 | 159 ± 2 |
| 1300/550 (2X) | 9.09 ± .03 | 8.63 ± .02 | 83.1 ± .4 | 67.0 ± .5 | 382 ± 4 | 427 ± 5 |
| 1300/600 | 9.36 ± .08 | 9.92 ± .08 | 159.9 ± .5 | 167.3 ± .5 | 211 ± 3 | 226 ± 4 |
| 1350/600 | 10.19 ± .05 | 11.68 ± .02 | 163.0 ± .5 | 167.9 ± .5 | 245 ± 4 | 312 ± 4 |

Systematic variations in extracted parameters with process conditions are observed. The extracted carrier parameters show little sensitivity to the As thermal anneal (columns labeled "Pre-soak"). This is expected since the AI step occurred after the As thermal anneal (prior to B implantation). When the 1300° C./550° C. flash anneal is repeated, the diffusion length increases by a factor of ≈1.5×, while the recombination lifetimes are reduced by ≈10%. When the base temperature of the flash anneal is increased to 600° C., the carrier recombination lifetime roughly doubles, indicating this higher base temperature results in better removal of the AI damage. However, the observed diffusion length only increases ≈10% (with respect to the repeated 1300° C./550° C. anneal). This behavior indicates the repeated 1300° C./550° C. flash anneal achieves good junction activation but does not completely anneal the AI damage. Thus, using the Z-scan PMR technique, the effect of the process conditions on carrier transport properties are easily observed. This capability allows a semiconductor device manufacturer to tailor process conditions to achieve (and control) the desired result, and is therefore of great practical value in semiconductor manufacturing. For all samples tested, the measured mobilities comport with values expected from the activated doping levels. The estimated uncertainties in the extracted mobilities remains less than 2% in all cases.

In sum, the analytic parametrization for the Z dependence of the PMR signal in terms of carrier diffusion length enables the direct, high precision determination of carrier diffusion lengths, recombination lifetimes, and/or diffusion coefficients using a nonlinear regressive fit to data obtained from a simple optical arrangement. For example, once the diffusion length and recombination lifetime (and their estimated uncertainties) are known from the fit procedure, these carrier transport properties may be used to evaluate the diffusion coefficient, or equivalently, the carrier mobility (via the Einstein relation). Alternatively, low and high frequency PMR amplitude curves can be fit to obtain the carrier diffusion length and diffusion coefficient, respectively, which then may be used to evaluate the recombination lifetime. And once the mobility and the recombination time are known, the carrier effective mass may likewise be evaluated. In addition, the PMR amplitude at focus has been previously used to characterize active doping concentration (i.e. through the dependence of Eq. (1) on $N_e$) [Chism 2010]. Therefore, provided the active dopant concentration is determined from the PMR amplitude at focus (or otherwise), the mobility as measured from the Z-scanning PMR technique may be used to characterize the sheet resistance $R_s$ via the relation $R_s \propto 1/\mu N_e$. Thus, it is clear the PMR technique disclosed here may be of immediate practical use in semiconductor device manufacturing.

The sensitivity of the embodiments to electronic transport properties follows from a non-obvious point of Gaussian beam physics, namely that the propagation of the reflected probe laser beam in a PMR apparatus is determined solely by the focal parameters and the (complex) carrier diffusion length. Treatment of the reflected probe beam via the method of Gaussian decomposition (while correctly accounting for carrier diffusion) results in an analytic expression for the Z dependence of the PMR signal in terms of electronic transport properties. This analytic expression enables a nonlinear regression analysis to adjust the variables within a parametrized functional form to provide an optimum fit to the PMR data and to thereby determine semiconductor transport parameters with high precision. In addition, the analytic expression for the Z dependence of the PMR signal in terms of electronic transport properties may be utilized to optimize system design for sensitivity to electronic transport properties. For example, by by plotting "dyda (3) " as given in the exemplary amplitude-fit subroutine as a function of Z, the sensitivity of PMR amplitude to carrier diffusion length for various system parameters may be understood. (Similarly, the sensitivity of PMR phase to carrier lifetime may be understood by plotting "dyda (7) " as given in the exemplary phase-fit subroutine as a function of Z.) Further, Eq. (6) and/or its analogs may be used to select and optimize the optical configuration for sensitivity to electronic transport properties for a given sample structure.

Figure 5:
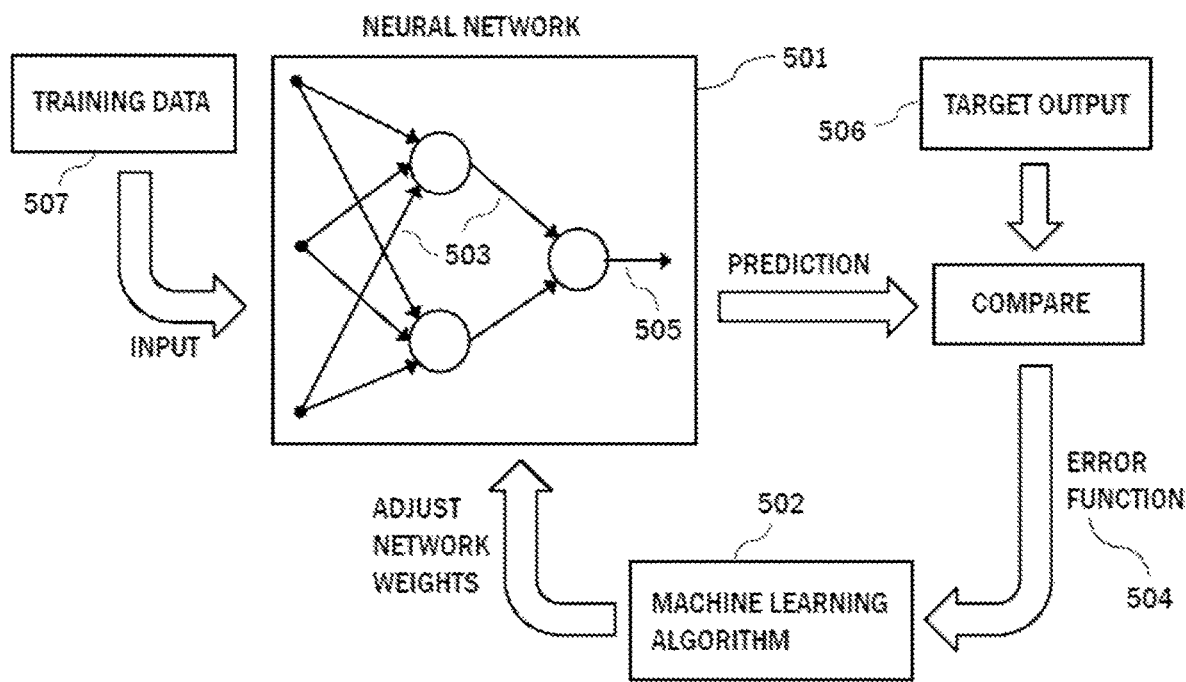
FIG. 5 illustrates an exemplary schematic representation of a neural network and its associated training procedure, as known in the prior art.

Moreover, the sensitivity of Z-scan PMR data to electronic transport properties enables a trained neural network to predict such properties from raw PMR data. Neural networks are nonparametric mathematical models with the ability to "learn" correlations between data and sample properties and to generalize on previously unseen data. (Here, the term "nonparametric" refers to the fact the mathematical model does not come from some underlying physical theory as in conventional "parametric" regression analysis, but rather is dictated by the form of the network itself.) FIG. 5 shows a representation of a neural network 501 and associated training procedure as known in the prior art. It is to be understood the representation of the neural network of FIG. 5 is merely schematic and that the neural network may take any suitable form [F. van Veen, "A mostly complete chart of Neural Networks," The Asimov Institute, copyright 2016, 1 page in length.]. The training set generally consists of a group of "input-output pairs" such as collections of training data 507 for which target output values 506 (sometimes also known as "ground truth" values) have been independently determined. The training procedure or "machine learning algorithm" 502 adjusts the internal parameters or "weights" 503 of the network to minimize an error function 504 analogous to the chi-square, typically involving the sum of the squares of the differences between the output of the network (i.e. the predicted values 505) and the target output values 506 $\Sigma\Sigma(P_i-T_i)^2$, where $P_i$ refers to the predicted values 505, and $T_i$ refers to the target output values 506, respectively, and the summation is over all predicted values 505 and over the training set [W. S. SARLE, "Neural Networks and Statistical Models," Proceedings of the Nineteenth Annual SAS Users Group International Conference, Apr., 1994, 13 pages.]. Thus the training of a neural network reduces to least squares optimization as further described, for example; in B. M. WILAMOWSKI et al., "Efficient Algorithm for Training Neural Networks with one Hidden Layer," Proc. Intl. Joint Conf Neural Networks, vol. 3, 1725-1728 (1999), B. M. WILAMOWSKI and H. YU, "Improved Computation for Levenberg-Marquardt Training," IEEE Trans. Neural Networks 21, 930-937 (2010), Y-T. KWAK, "An accelerated Levenberg-Marquardt algorithm for feedforward network," J. Korean Data & Info. Sci. Soc. 23, 1027-1035 (2012), and B. TOMISLAV et al., "GPU Implementation of the Feedforward Neural Network with Modified Levenberg-Marquardt Algorithm," 2014 Intl. Joint Conf. Neural Networks, pp. 785-791. A smoothing or "regularization" term may be also added to the error function 504 to mitigate overfitting, as is known in the art.

In certain non-exclusive embodiments, the training set consists of collections of raw Z-scan PMR data taken from samples for which certain electronic transport properties have been determined (e.g., by the parametric nonlinear regression analysis of the embodiments or by other conventional means). The neural network then learns to map input Z-scan PMR data to target electronic transport properties for a particular training set. Note that for raw PMR input data, the trained neural network encodes the information about the PMR system parameters and the Z-independent PMR sample parameters within the hidden weights of the network. Therefore, for a common set of samples for which certain electronic transport properties have been determined, a neural network trained using input data from a particular Z-scanning PMR system will automatically match the output of a neural network trained using input data taken from a second Z-scanning PMR system. Thus the use of a trained neural network to predict electronic transport properties from raw Z-scan PMR data provides inherent tool-to-tool matching.

Figure 6:
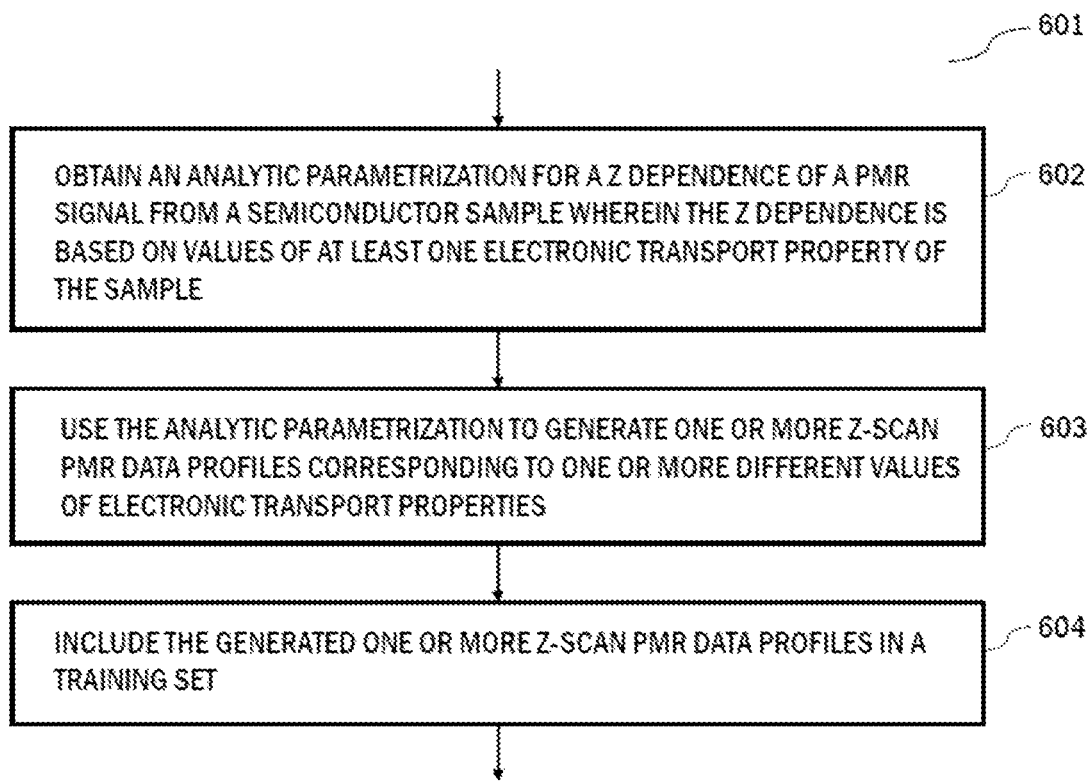
FIG. 6 illustrates a method of using an analytic parametrization for augmenting a training set, in accordance with certain embodiments of the invention.

However, given the need for training data over (or even outside) the process window, the use of a neural network to predict electronic transport properties is typically less efficient than parametric nonlinear regression analysis. This disadvantage can be mitigated to some extent by using Eq. (6) or its analogs to generate synthetic training data. For example, by using Eq. (6) or its analogs to perform a nonlinear regression analysis to determine an electronic transport property from a measured Z-scan PMR profile, a single input-output training pair may be generated. Then additional synthetic training pairs may be generated by varying the values of the electronic transport parameters in Eq. (6) or its analogs while holding the other parameters (e.g. A, $\phi_o$, $\omega_p$, $\omega_o$, and $\Omega$) fixed at their values as determined from the nonlinear regression analysis. Similarly, using a single input-output training pair consisting of raw Z-scan PMR data taken from particular sample for which certain electronic transport properties have been determined by conventional means (and thus representative of a ground truth at a particular point in the semiconductor manufacturing process flow), the analytic parametrization of Eq. (6) or its analogs may be used in a nonlinear regression analysis to provide an optimized fit to the input Z-scan PMR data while holding the parameters representing the ground truth electronic transport properties fixed. Then synthetic training data may again be generated by varying the values of the electronic transport parameters in Eq. (6) or its analogs while holding the other parameters fixed at their values as determined from the nonlinear regression analysis. Accordingly, as illustrated in FIG. 6, a method 601 for augmenting a training set includes: obtaining an analytic parametrization for a Z dependence of a PMR signal from a semiconductor sample, wherein the analytic parametrization is based on values of at least one electronic transport property of the sample (step 602); using the analytic parametrization to generate one or more Z-scan PMR data profiles corresponding to one or more different values of electronic transport properties (step 603); and including the generated one or more Z-scan PMR profiles in the training set (step 604).

Of course, for process development purposes, or for process control applications demanding measurement of electronic transport properties at a particular point in a manufacturing process flow, parametric nonlinear regression analysis of the disclosure will likely remain preferred to prediction via neural networks. This is because the data driven training and/or use of a neural network fails to make use of known physics (whereas the parametric model of a parametric nonlinear regression analysis typically derives from some underlying physical theory the data are supposed to satisfy). In a more general sense, this drawback can be mitigated, at least in part, by incorporating known physics into the error function used to train the neural network, resulting in what is referred to as a "physics-informed" or "physics-constrained" neural network [J. ADLER and O. OKTEM, "Solving ill-posed inverse problems using iterative deep neural networks," arXiv preprint arXiv: 1704.04058v2 (2017); M. RAISSI et al., "Physics-Informed Neural Networks: A Deep Learning Framework for Solving Forward and Inverse Problems Involving Nonlinear Partial Differential Equations," preprint submitted to J. Comp. Phys., Oct. 26, 2018, 45 pages; Y. CHEN et al., "Physics-informed neural networks for inverse problems in nano-optics and metamaterials," Optics Express 28, 11618-11633 (2020); G. E. KARNIADAKIS et al., "Physics-informed machine learning," Nature Reviews 3, 422-440 (2021); L. van RUEDEN et al., "Informed Machine Learning—A Taxonomy and Survey of Integrating Prior Knowledge into Learning Systems," arXiv preprint arXiv:1903.12394v3 (2021); S. CUOMO et al., "Scientific Machine Learning through Physics-Informed Neural Networks: Where we are and What's next," arXiv preprint arXiv:2201.05624v2 (2022).]. The motivation is similar to the motivation for adding a regularization term to the error function, namely to penalize unphysical solutions and enhance robustness of the neural network's predictions. The basic approach to incorporating known physics into the error function is likewise similar: (i) represent the known physics by some relevant mathematical equation (e.g., relating input data, output values, derivatives thereof, etc.), (ii) arrange the equation such that one side is equivalent to zero, and (iii) add this term to the conventional error function to be minimized by the machine learning algorithm. (It may be appreciated this approach is fundamentally an implementation of constrained optimization using Lagrangian methods, as are known in the art [D. P. Bertsekas, *Constrained Optimization and Lagrange Multiplier Methods*, Academic Press, 1982; republished by Athena Press, 1996, ISBN 1-886529-04-3, 410 pages.].) Thus known physical constraints may be incorporated in the network training procedure.

For a basic example involving training a neural network to predict electronic transport properties from Z-scan PMR data, from Eq. (8) it may be appreciated that for a particular Z-scan PMR phase profile, in the 3D limit the phase will approach $\phi \approx \phi_o + \arctan\{\Omega\tau\}$, whereas in the 1D limit the phase will approach $\phi \approx \phi_o$. The difference in the respective phase limits implies $\Omega\tau \approx \tan\{\Delta\phi\}$, where $\Delta\phi$ is just the total variation observed in the phase data (or $\Omega\tau \approx \tan\{2\Delta\phi\}$ for the case with carrier diffusion in effectively only one direction along the sample). (Thus, provided the strong 3D and 1D limits are realized, the recombination time is effectively decoupled from the focal parameters and may essentially be read off the raw Z-scan PMR phase data.) Then a penalty term of the form $\eta[\Omega\tau_i-\tan\{\Delta\phi_i\}]$, where $\eta$ is a Lagrange multiplier (sometimes also referred to as a "hyperparameter" or "shadow price") which governs the influence of the known physics and the index i again refers to elements of the training set (i.e. the input-output pairs), may be added to the error function to be minimized by the machine learning algorithm. For a more subtle example, since Eq. (6) expresses complex input data (i.e. the complex PMR vector) in terms of a complex variable (e.g. the square of the complex diffusion length), the Cauchy-Riemann relations may be enforced vis-à-vis a pair of penalty terms of the form $\eta[\partial A_i/\partial x_i-A_i \partial\phi_i/\partial y_i]$, $\eta[\partial A_i/\partial y_i+A_i\partial\phi_i/\partial x_i]$, where $\{A_i, \phi_i\}$ refer to one or more data points from a particular Z-scan PMR profile, and x, and y, refer to the real and imaginary components of the complex variable, respectively. (Note that if the complex variable is taken to be the square of the complex diffusion length, $x_i = L_i^2/[1+(\Omega\tau_i)^2]$ and $y_i = -L_i^2\Omega\tau_i/[1+(\Omega\tau_i)^2]$.) (Alternatively, such Cauchy-Riemann penalty terms take the form $\eta[\partial A_i/\partial\rho_i-(A_i/\rho_i)\partial\phi_i/\partial\theta_i]$, $\eta[(1/\rho_i)\partial A_i/\partial\theta_i+A_i\partial\phi_i/\partial\rho_i]$, where $\rho_i$ and $\theta_i$ refer to the amplitude and phase of the complex variable.) It should further be appreciated that the one or more data points $\{A_i, \phi_i\}$ may be selected for optimal sensitivity to electronic transport properties. Such derivative-based physics-informed penalty terms may be efficiently incorporated into the machine learning algorithm using "automatic" or "algorithmic" differentiation, as known in the art [A. G. Baydin et al., "Automatic Differentiation in Machine Learning: a Survey," arXiv preprint arXiv:1502.05767v4 (2018); C. C. Margossian, "A Review of Automatic Differentiation and its Efficient Implementation," arXiv preprint arXiv: 1811.05031v2 (2019).].

On the other hand, the key advantage of machine learning algorithms is precisely that they do not require prior knowledge of the relationship between input data and output predictions, merely that information predictive of the output is present in the input set. For example, machine learning can be used for control of a semiconductor process tool provided that some adjustment of process control "knobs" will produce target semiconductor properties [U.S. Pat. No. 11,093,084 issued Aug. 17, 2021 to Rothstein et al.; U.S. Pat. App. Pub. No. US 2022/0035979 A1 dated Feb. 3, 2022 to Moffat et al.]. The process control model may also be used to update process control settings in view of sensor data to produce desired sample properties [U.S. Pat. App. Pub. No. US 2020/0111689 A1 dated Apr. 9, 2020 to BANNA et al.; U.S. Pat. App. Pub. No. US 2020/0264335 A1 dated Aug. 20, 2020 to Bhatia et al.; U.S. Pat. App. Pub. No. US 2020/0303266 A1 dated Sep. 24, 2020 to JEUNG et al.; U.S. Pat. App. Pub. No. US 2020/0333774 A1 dated Oct. 22, 2020 to BANNA; U.S. Pat. App. Pub. No. US 2022/0066411 A1 dated Mar. 3, 2022 to Ummethala et al.; U.S. Pat. App. Pub. No. US 2022/0083034 A1 dated Mar. 17, 2022 to Wu.]. As specific to controlling semiconductor process tools, electronic transport properties as determined or predicted from Z-scan PMR data may be used as ground truth values (i.e. provided as output targets) to train a machine learning based process control model that correlates electronic transport properties with tool sensor data (such as, for example, the setting of process control knobs, values of processing parameters available from the tool such as temperature, pressure, gas flow, etc., other on-board metrology data, or the like). Thus embodiments of the systems and methods for Z-scanning PMR characterization of electronic transport properties may be used to enable machine learning based control of semiconductor process tools.

Of course, the full potential of machine learning in semiconductor manufacturing may be realized in deep learning scenarios such as the application of large neural networks to maximize overall manufacturing yield. (Such attempts are described, for example, in U.S. Pat. No. 7,359,759 issued Apr. 15, 2008 to Cheng et al., U.S. Pat. App. Pub. No. US 2014/0303912 A1 dated Oct. 9, 2014 to Banerjee et al., and U.S. Pat. No. 9,330,985 issued May 3, 2016 to Vaid et al.) For example, since semiconductor device performance depends fundamentally on carrier transport properties, and in view of the fact many manufacturing process steps have the potential to alter or degrade such transport properties, electronic transport properties as determined or predicted from Z-scan PMR data at various points in the manufacturing process flow may be provided as input data to train a machine learning based process control model that correlates manufacturing yield with such in-line measurements of carrier transport properties. Thus the input of electronic transport properties as determined or predicted from Z-scan PMR data into a machine learning based process control model may be used to maximize manufacturing yield in volume semiconductor production.

Moreover, the input of electronic transport properties at various points in the semiconductor manufacturing process flow may be used to facilitate advanced reinforcement learning algorithms as described, for example, in U.S. Pat. No. 10,839,302 issued Nov. 17, 2020 to Wright et al. (which is expressly incorporated herein in its entirety by this reference). In particular, reinforcement learning is a type of machine learning that enables optimization of process control objectives by specifying a "reward function" that assigns a scalar quality measure to the system state at each time step [B. KIUMARSI et al., "Optimal and Autonomous Control Using Reinforcement Learning: A Survey," IEEE Trans. Neural Netw. Learn. Syst. 29, 2042-2061 (2018); S. SPIELBERG et al., "Deep Reinforcement Learning for Process Control: A Primer for Beginners," arXiv preprint arXiv:2004.05490v1 (2020); Z. J. VIHAROS and R. JAKAB, "Reinforcement Learning for Statistical Process Control in Manufacturing," Measurement 182, 109616 (2021); J. DEGRAVE et al., "Magnetic control of tokamak plasmas through deep reinforcement learning," Nature 602, 414-433 (2022).]. The objectives are specified as individual reward components that track an aspect of the manufacturing process (typically a physical property) and combined into a single scalar reward value. The reinforcement learning algorithm then optimizes combinations of time-varying targets to maximize manufacturing yield. Thus the reward function penalizes the control model for reaching undesired intermediate states. A well-designed reward function will be minimally specified, giving the reinforcement learning algorithm maximum flexibility to attain the desired terminal state. Thus, in view of the fundamental dependence of semiconductor device performance on electronic transport properties, the inclusion of individual reward components that track electronic transport properties at points in the manufacturing process flow in the reward function enables the reinforcement learning algorithm to efficiently recognize yield-predictive patterns within the potentially vast amount of available manufacturing data.

Figure 7:
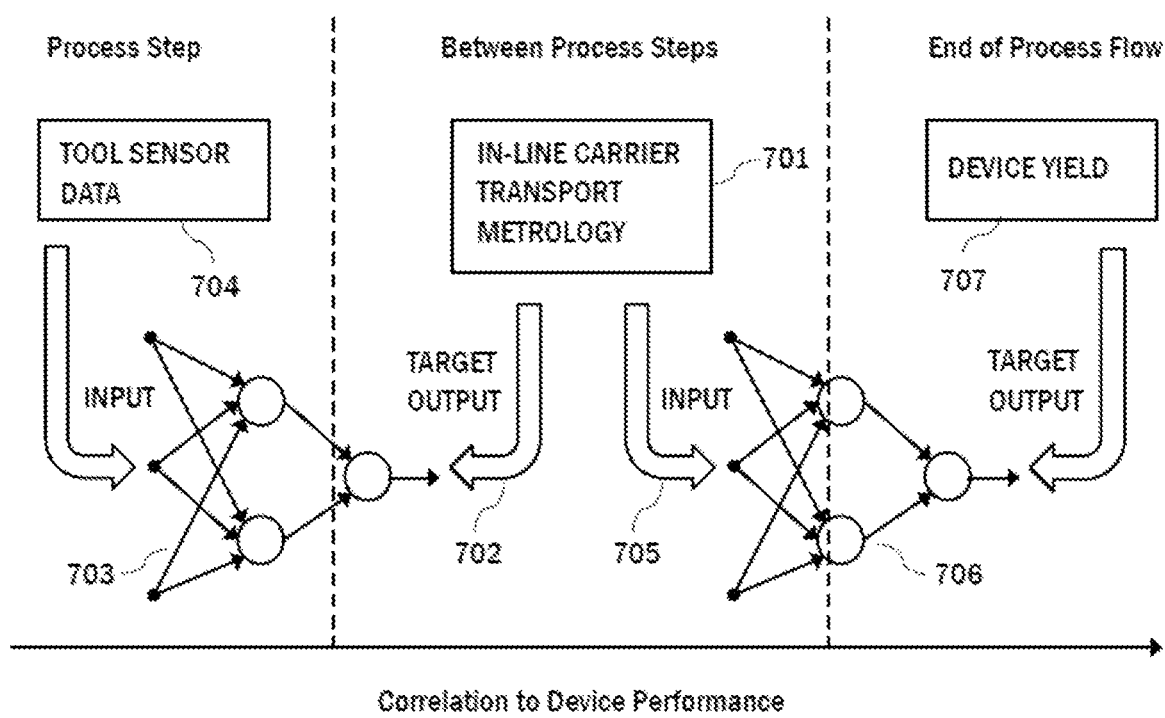
FIG. 7 illustrates points in a semiconductor manufacturing flow wherein in-line precision carrier transport metrology may be employed to implement machine learning based process control in semiconductor manufacturing, in accordance with certain embodiments of the invention.

FIG. 7 shows, in a schematic representation, exemplary points in the semiconductor manufacturing flow wherein in-line carrier transport metrology 701 may be used to effectuate machine learning based process control in semiconductor manufacturing. For example, electronic transport properties as determined or predicted from Z-scanning PMR data may be provided as output targets 702 to train a machine learning based process control model 703 that correlates electronic transport properties with tool sensor data 704, or may be provided as input data 705 to train a machine learning based process control model 706 that correlates electronic transport properties with manufacturing yield 707. It is to be understood the representations of the machine learning based process control models of FIG. 7 (703 and 706) are merely schematic and that the process control models may take any suitable form, including reinforcement learning based process control models.

Therefore, according to various non-exclusive embodiments, a method for controlling a semiconductor process tool includes: establishing a machine learning based process control model that correlates sensor data from the semiconductor process tool with one or more electronic transport properties of a semiconductor wafer processed by the process tool; receiving sensor data from the semiconductor process tool; using the process control model to predict, from the received sensor data, one or more electronic transport properties of a semiconductor wafer processed by the process tool; receiving one or more ground truth electronic transport properties of the semiconductor wafer processed by the process tool, wherein said one or more ground truth electronic transport properties have been determined using one or more Z-scan PMR data profiles acquired from the semiconductor wafer processed by the process tool; comparing the one or more ground truth electronic transport properties with the one or more predicted electronic transport properties; and using the process control model to update operational settings of the process tool for wafers to be processed to minimize wafer-to-wafer variability of electronic transport properties.

In additional non-exclusive embodiments, a method for controlling a semiconductor manufacturing process includes: establishing a machine learning based process control model that correlates the yield of the semiconductor manufacturing process with one or more sample electronic transport properties present at one or more points in the manufacturing process; receiving one or more sample electronic transport properties present at one or more points in the manufacturing process, wherein said one or more sample electronic transport properties have been determined or predicted from one or more acquired Z-scan PMR data profiles; using the process control model to obtain one or more outputs indicative of the yield of the semiconductor manufacturing process; and using the process control model to update one or more processing conditions to maximize the predicted yield of the semiconductor manufacturing process.

As may be understood, wide variation is possible in the foregoing embodiments. Various arrangements of Z-scanning PMR systems and methods for the characterization of electronic transport properties, including but not limited to a wide variety of optical configurations, parametric and/or non-parametric analyses or the like, may be employed. Non-exclusive embodiments include unitized features of the systems and combined steps of methods, as well as component and separation options. Although certain operations and elements for operation are disclosed, numerous other steps, operations, similar elements, processes and methods, as well as suitable modifications and equivalents may be resorted to, all falling within the scope of the disclosure. Further, the embodied Z-scanning PMR systems and methods may be used in various semiconductor process control applications, ranging from, but not limited to, control of individual process tools to control of overall manufacturing yield.

Although the use of Z-scanning PMR systems and methods in certain process control applications have been detailed, it should be appreciated the use of Z-scanning PMR systems and methods in other present and future process control technologies are inherent to the disclosure.

In the foregoing, therefore, the invention has been described with reference to specific embodiments. One of ordinary skill in the art will appreciate, however, that various modifications, substitutions, deletions, and additions can be made without departing from the scope of the invention. Accordingly, the specification and figures are to be regarded in an illustrative rather than a restrictive sense, and all such modifications substitutions, deletions, and additions are intended to be included within the scope of the invention. Any benefits, advantages, or solutions to problems that may have been described above with regard to specific embodiments, as well as device(s), connection(s), step(s) and element(s) that may cause any benefit, advantage, or solution to occur or become more pronounced, are not to be construed as a critical, required, or essential feature or element.

The disclosures of all patents, patent applications, and publications cited herein are hereby incorporated herein by reference in their entirety, to the extent that they provide exemplary, procedural, or other details supplementary to those set forth herein.

What is claimed is:

1. A method for evaluating a semiconductor sample, comprising:
   establishing a trained neural network that correlates Z-scan PMR data from the sample with at least one electronic transport property of the sample;
   acquiring Z-scan PMR data from the sample; and
   using the trained neural network to predict at least one electronic transport property of the sample from the acquired Z-scan PMR data.

2. The method of claim 1, wherein the step of establishing a trained neural network comprises:
   providing a set of Z-scan PMR profiles corresponding to a range of sample processing conditions;
   providing a set of electronic transport properties corresponding to the provided set of Z-scan PMR profiles;
   forming a group of input-output pairs consisting of the set of Z-scan PMR profiles and the corresponding set of electronic transport properties; and
   training the neural network using the group of input-output pairs as a training data set.

3. A method of augmenting a training set, comprising:
   obtaining an analytic parametrization for a Z dependence of a PMR signal from a semiconductor sample, wherein the analytic parametrization is based on values of at least one electronic transport property of the sample;
   using the analytic parametrization to generate one or more Z-scan PMR data profiles corresponding to one or more different values of the at least one electronic transport property of the sample; and
   including the one or more Z-scan PMR profiles in the training set.

4. A method of establishing a physics-informed neural network, comprising:
   obtaining an analytic parametrization for a Z dependence of a PMR signal from a sample, wherein the analytic parametrization is based on values of at least one electronic transport property of the sample;
   using the analytic parametrization to form a physics-informed penalty term that relates a Z dependence of a PMR signal from a sample to at least one electronic transport property of the sample;

adding the physics-informed penalty term to an error function to be minimized by a machine learning algorithm to form a physics-informed error function;

training the neural network using the physics-informed error function.

5. A method of establishing a physics-informed neural network, comprising:

obtaining an analytic parameterization representing complex input data in terms of a complex variable, wherein the complex variable is defined in terms of at least one target output value;

using the Cauchy-Riemann relations to form a pair of penalty terms relating derivatives of the complex input data with respect to the at least one target output value;

adding the pair of penalty terms to an error function to be minimized by a machine learning algorithm to form a physics-informed error function;

training the neural network using the physics-informed error function.

6. The method of claim 5, wherein the pair of penalty terms take the form:

$$\eta[\partial A_i/\partial x_i - A_i \partial \varphi_i/\partial y_i], \eta[\partial A_i/\partial y_i + A_i \partial \varphi_i/\partial x_i],$$

where $\eta$ is a Lagrange multiplier, $A_i$ and $\varphi_i$ refer to the amplitude and phase of one or more complex input data points, respectively, and $x_i$ and $y_i$ refer to the real and imaginary components of the complex variable, respectively, and the index i refers to elements of the training set.

7. The method of claim 5, wherein the pair of penalty terms take the form:

$$\eta[\partial A_i/\partial \rho_i - (A_i/\rho_i)\partial \varphi_i/\partial \theta_i], \eta[(1/\rho_i)\partial A_i/\partial \theta_i + A_i \partial \varphi_i/\partial \rho_i],$$

where $\eta$ is a Lagrange multiplier, $A_i$ and $\varphi_i$ refer to the amplitude and phase of one or more complex input data points, respectively, and $\rho_i$ and $\theta_i$ refer to the amplitude and phase of the complex variable, respectively, and the index i refers to elements of the training set.

8. The method of claim 5, wherein the step of training the neural network comprises automatic differentiation.

9. A method for controlling a semiconductor process tool, the method executed by a computer and comprising:

establishing a machine learning based process control model that correlates sensor data from the semiconductor process tool with one or more electronic transport properties of a semiconductor wafer processed by the process tool;

receiving sensor data from the semiconductor process tool;

using the process control model to predict, from the received sensor data, one or more electronic transport properties of a semiconductor wafer processed by the process tool;

receiving one or more ground truth electronic transport properties of the semiconductor wafer processed by the process tool, wherein said one or more ground truth electronic transport properties have been determined using one or more Z-scan PMR data profiles acquired from the semiconductor wafer processed by the process tool;

comparing the one or more ground truth electronic transport properties with the one or more predicted electronic transport properties; and using the process control model to update operational settings of the process tool for wafers to be processed to minimize wafer-to-wafer variability of electronic transport properties.

10. The method of claim 9, wherein sensor data from the semiconductor process tool comprises optical measurement data acquired from an on-board metrology module.

11. The method of claim 9, wherein the process control model comprises a reinforcement learning algorithm.

12. A method for controlling a semiconductor manufacturing process, the method executed by a computer and comprising:

establishing a machine learning based process control model that correlates the yield of the semiconductor manufacturing process with one or more sample electronic transport properties present at one or more points in the manufacturing process;

receiving one or more sample electronic transport properties present at one or more points in the manufacturing process, wherein said one or more sample electronic transport properties have been determined or predicted from one or more acquired Z-scan PMR data profiles;

using the process control model to obtain one or more outputs indicative of the yield of the semiconductor manufacturing process; and using the process control model to update one or more processing conditions to maximize the predicted yield of the semiconductor manufacturing process.

13. The method of claim 12, wherein the process control model comprises a physics-informed neural network.

14. The method of claim 12, wherein the process control model comprises a reinforcement learning algorithm.

* * * * *